(12) United States Patent
Nagata

(10) Patent No.: US 10,495,915 B2
(45) Date of Patent: Dec. 3, 2019

(54) MULTIPLE PANEL SUBSTRATE, DISPLAY DEVICE AND METHOD OF MANUFACTURING DISPLAY DEVICE

(71) Applicant: Japan Display Inc., Tokyo (JP)

(72) Inventor: Tetsuya Nagata, Tokyo (JP)

(73) Assignee: Japan Display Inc., Tokyo (JP)

( * ) Notice: Subject to any disclaimer, the term of this patent is extended or adjusted under 35 U.S.C. 154(b) by 102 days.

(21) Appl. No.: 15/632,476

(22) Filed: Jun. 26, 2017

(65) Prior Publication Data

US 2018/0031903 A1 Feb. 1, 2018

(30) Foreign Application Priority Data

Jul. 29, 2016 (JP) .................... 2016-149328

(51) Int. Cl.
*H01L 23/31* (2006.01)
*H01L 27/32* (2006.01)
*H01L 51/56* (2006.01)
*G02F 1/1335* (2006.01)
*H05B 33/10* (2006.01)

(52) U.S. Cl.
CPC .. *G02F 1/133502* (2013.01); *G02F 1/133553* (2013.01); *H01L 23/3171* (2013.01); *H01L 27/3244* (2013.01); *H01L 51/56* (2013.01); *H05B 33/10* (2013.01); *H01L 2251/566* (2013.01)

(58) Field of Classification Search
None
See application file for complete search history.

(56) References Cited

U.S. PATENT DOCUMENTS

| 8,842,254 B2 * | 9/2014 | Kaneko | G02F 1/13452 349/158 |
| 2001/0019373 A1 * | 9/2001 | Kobayashi | G02F 1/136213 349/39 |
| 2001/0026125 A1 * | 10/2001 | Yamazaki | H01L 27/3246 313/505 |

FOREIGN PATENT DOCUMENTS

JP 2010-224426 A1 10/2010

* cited by examiner

*Primary Examiner* — Ashok Patel
(74) *Attorney, Agent, or Firm* — Michael Best & Friedrich LLP

(57) ABSTRACT

A method of manufacturing a display device, the display device including, a substrate, a circuit element layer including a semiconductor layer, an insulation layer and a conducting layer, a bump part including at least one layer selected from the semiconductor layer, the insulation layer and the conducting layer forming the circuit element, and a sealing film, the method is provided including forming the circuit element layer in a display region of a plurality of display panels on a first surface above the substrate, forming the bump part in a boundary region of the plurality of display panels, forming the sealing film on approximately the entire surface of the plurality of display panels, and dividing the display panels at the bump part by cutting the substrate.

7 Claims, 25 Drawing Sheets

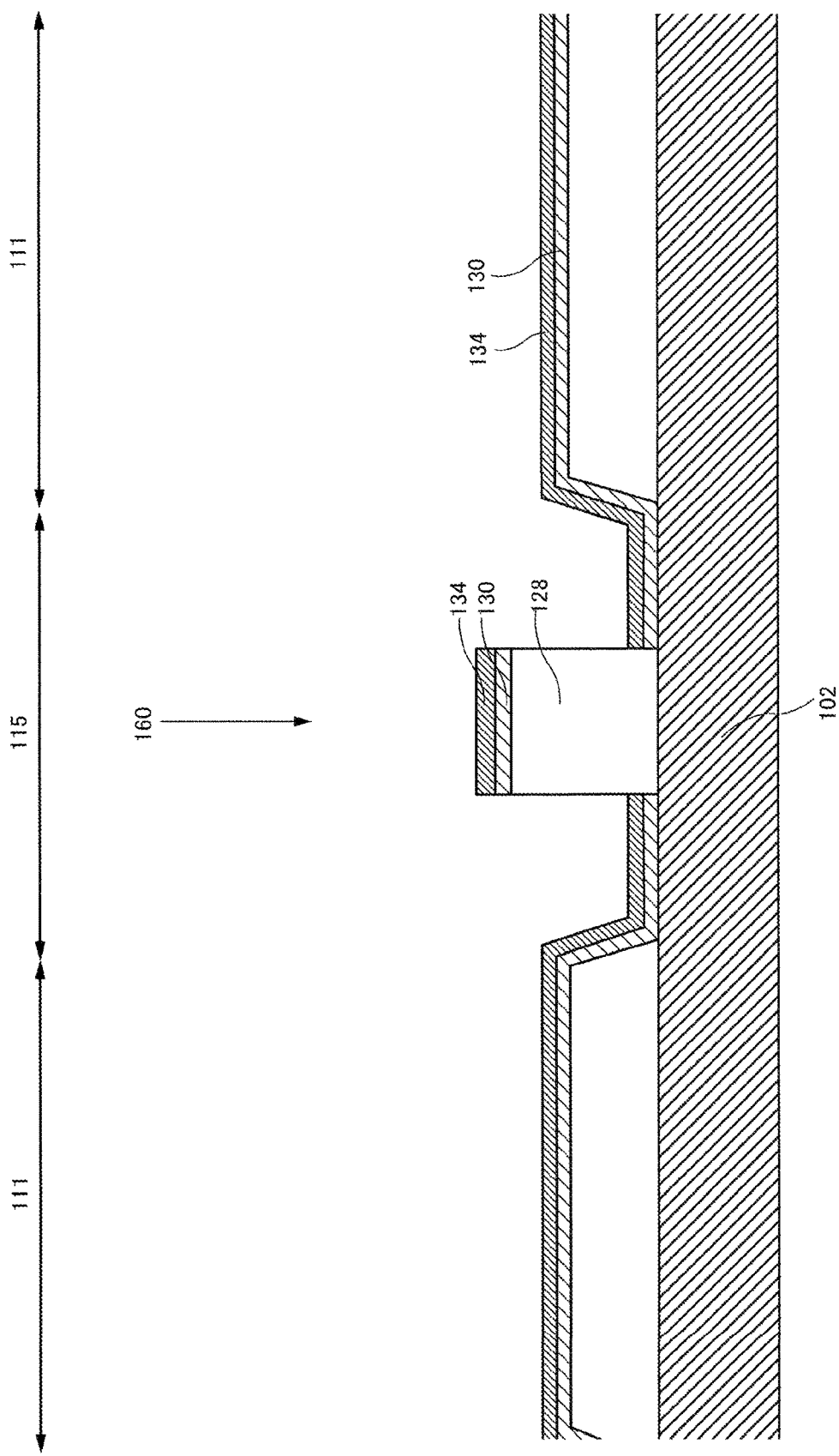

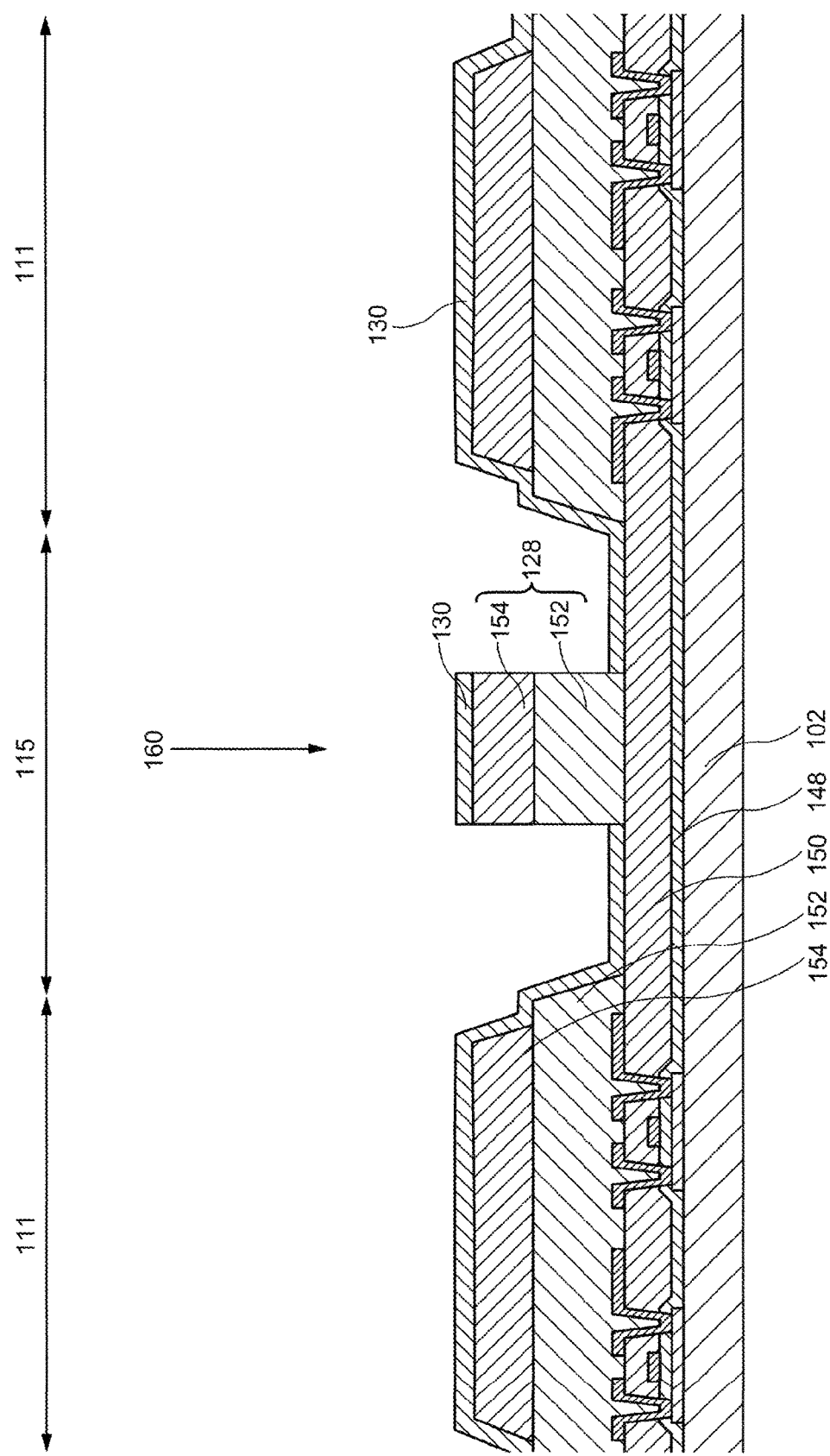

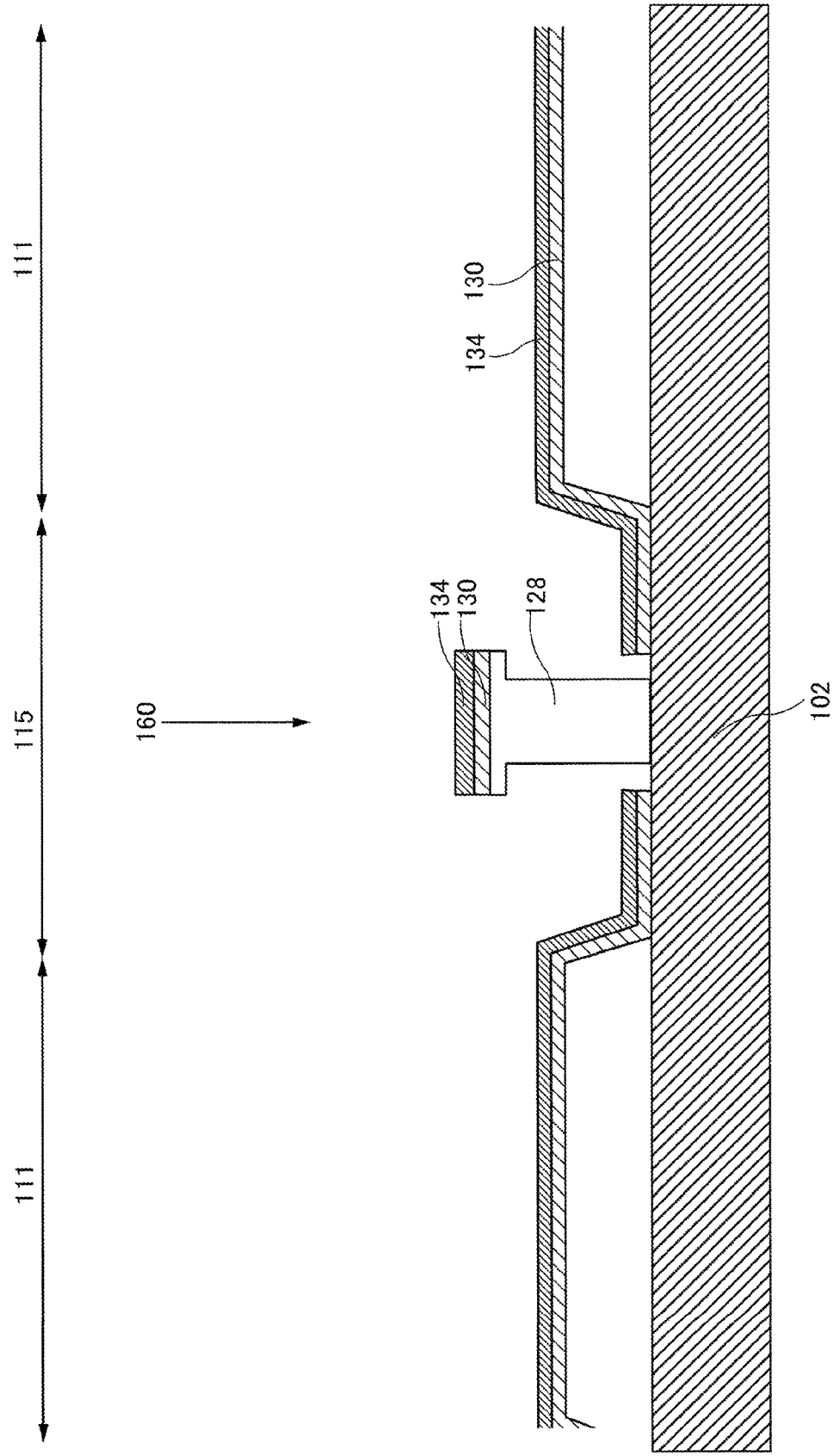

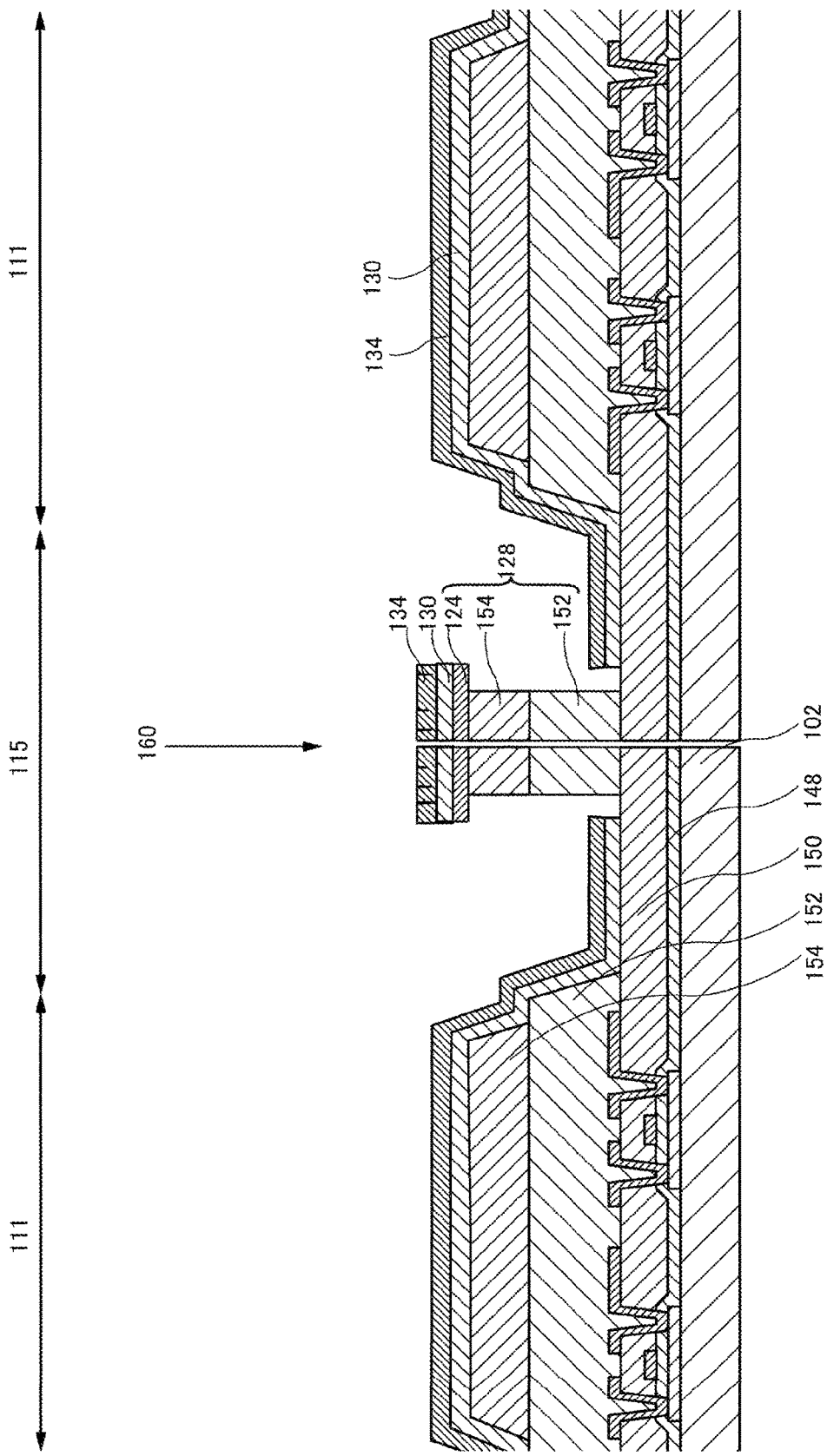

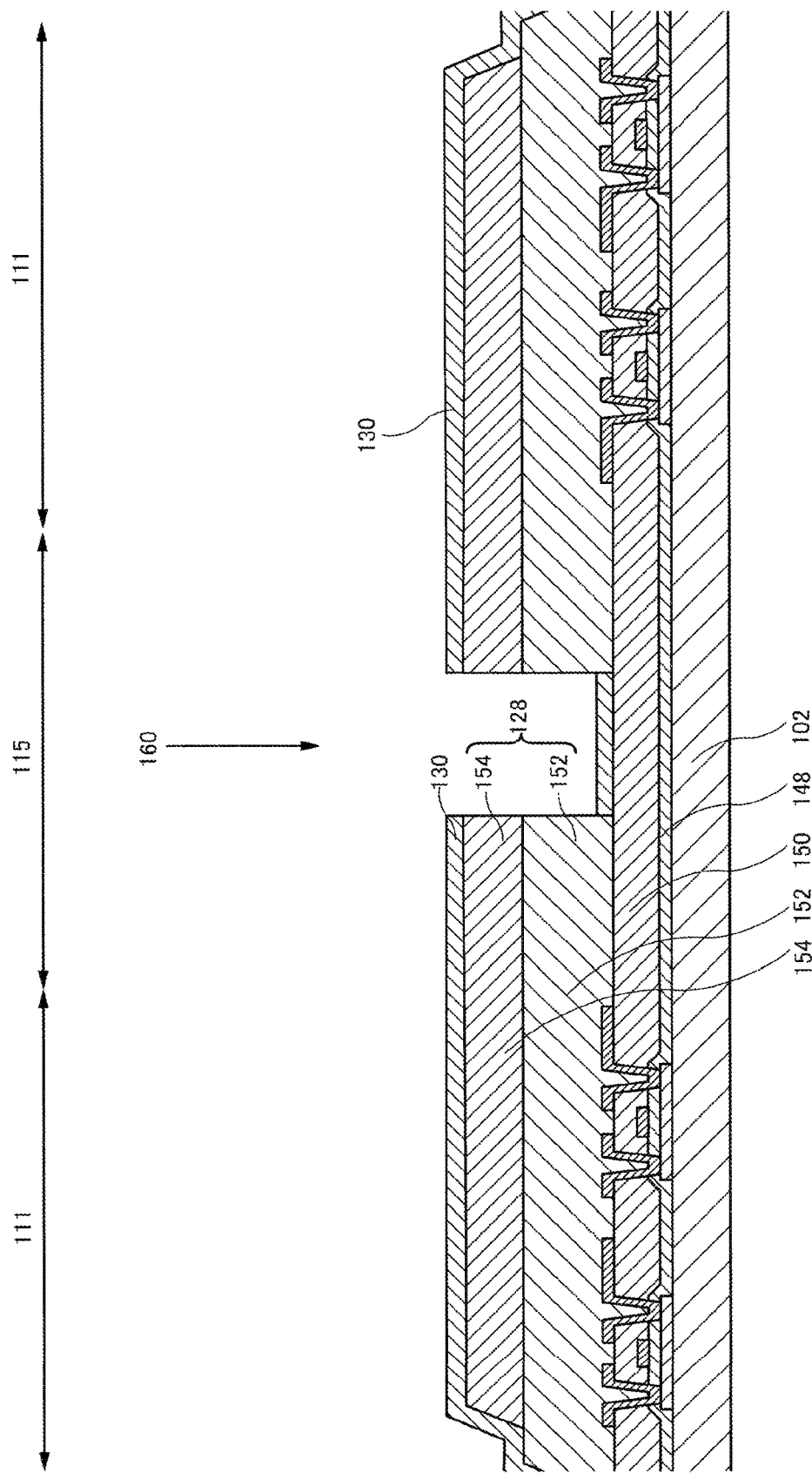

MULTIPLE PANEL SUBSTRATE, DISPLAY DEVICE AND METHOD OF MANUFACTURING DISPLAY DEVICE

CROSS REFERENCE TO RELATED APPLICATIONS

This application is based upon and claims the benefit of priority from the prior Japanese Patent Application No. 2016-149328, filed on Jul. 29, 2016, the entire contents of which are incorporated herein by reference.

FIELD

The present invention is related to a multiple panel substrate a display device and a method of manufacturing the display device.

BACKGROUND

A display device is arranged with a light emitting element in each pixel and displays an image by individually controlling emitted light. For example, in an organic EL display device using an organic EL element as a light emitting element, an organic EL element is arranged in each pixel and the organic EL element has a structure in which a layer including an organic EL material (referred to herein as [organic EL layer]) is sandwiched between a pair of electrodes comprised from an anode electrode and a cathode electrode. An organic EL display device is arranged with the anode electrode as an individual pixel electrode in each pixel, and the cathode electrode is arranged bridging a plurality of pixels as a common pixel electrode applied with a common potential. The organic EL display device controls light emitted from a pixel by applying the voltage of a pixel electrode to each pixel with respect to the potential of the common pixel electrode.

An organic EL layer is extremely weak to water and when water infiltrates from the exterior to the interior of a panel and reaches the organic EL layer, non-lighting regions called dark spots may be produced. Thus, in order to prevent water infiltrating to an organic EL layer, a measure has been adopted for forming a sealing film to cover a structure of a display region arranged with an organic EL element. For example, a structure in which an organic insulation film, and a side surface and upper and lower surfaces of the organic insulation film are stacked with an inorganic insulation film is generally used as a sealing film.

A method for preventing damage to a TFT array due to micro-cracks in a substrate periphery in a flexible TFT substrate by a transfer method is disclosed in Japanese Laid Open Patent Publication No. 2010-224426.

In a manufacturing method of a display device in which a plurality of display panels is formed simultaneously, it is necessary to individually cut a large scale multilayout panel for formation of plurality of panels. At this time, stress may concentrate on the sealing film and damage may occur.

SUMMARY

According to one embodiment of the present invention, a method of manufacturing a display device, the display device including, a substrate, a circuit element layer including a semiconductor layer, an insulation layer and a conducting layer, a bump part including at least one layer selected from the semiconductor layer, the insulation layer and the conducting layer forming the circuit element, and a sealing film, the method is provided including forming the circuit element layer in a display region of a plurality of display panels on a first surface above the substrate, forming the bump part in a boundary region of the plurality of display panels, forming the sealing film on approximately the entire surface of the plurality of display panels, and dividing the display panels at the bump part by cutting the substrate.

According to one embodiment of the present invention, a method of manufacturing a display device, the display device including, a substrate, a circuit element layer including a semiconductor layer, an insulation layer and a conducting layer, a plurality of bump parts including at least one layer selected from the semiconductor layer, the insulation layer and the conducting layer forming the circuit element, and, a sealing film, the method is provided including forming the circuit element layer in a display region of a plurality of display panels on a first surface above the substrate, forming the plurality of bump parts in a boundary region of the plurality of display panels, forming the sealing film on approximately the entire surface of the plurality of display panels, and dividing the display panels between the plurality of bump parts by cutting the substrate.

According to one embodiment of the present invention, a display device is provided including a display region including a circuit element layer including a semiconductor layer, an insulation layer and a conducting layer, a sealing region including a bump part including at least one layer selected from the semiconductor layer, the insulation layer and the conducting layer, the sealing region enclosing the display region, and a sealing film arranged on approximately the entire surface of the display region and the sealing region, wherein the sealing film is separated between an upper surface of the bump part and a region adjacent to the bump part in the sealing region.

According to one embodiment of the present invention, a display device is provided including a display region including a circuit element layer including a semiconductor layer, an insulation layer and a conducting layer, a sealing region enclosing the display region, and a sealing film arranged on the display region and the sealing region, wherein the sealing film has an end part in the sealing region, and wherein the end part of the sealing film has an inclined part where a film thickness of the sealing film decreases towards an outer periphery direction of the sealing region.

According to one embodiment of the present invention, a multiple panel substrate including a plurality of display panels on a first surface above a substrate, the multiple panel substrate is provided including the plurality of display panels including a circuit element layer including a semiconductor layer, an insulation layer and a conducting layer, a boundary region including a bump part including at least one layer selected from the semiconductor layer, the insulation layer and the conducting layer along at least one side of the display panel, and a sealing film arranged on approximately the entire surface of the plurality of display panels, wherein the sealing film is separated between an upper surface of the bump part and a region adjacent to the bump part in the sealing region.

According to one embodiment of the present invention, a multiple panel substrate including a plurality of display panels on a first surface above a substrate, the multiple panel substrate is provided including the plurality of display panels including a circuit element layer including a semiconductor layer, an insulation layer and a conducting layer, a boundary region including a bump part including at least one layer selected from the semiconductor layer, the insulation layer and the conducting layer along at least one side of the display panel, and a sealing film arranged on approximately the entire surface of the plurality of display panels, wherein the sealing film is separated between an upper surface of the bump part and a region adjacent to the bump part in the boundary region.

BRIEF DESCRIPTION OF DRAWINGS

FIG. 5A is a cross-sectional diagram showing an approximate structure of a cutting site in a manufacturing method related to one embodiment of the present invention;

FIG. 8B is a cross-sectional diagram showing a manufacturing method related to one embodiment of the present invention;

FIG. 9 is a cross-sectional diagram showing an approximate structure of a cutting site in a manufacturing method related to one embodiment of the present invention;

FIG. 11E is a cross-sectional diagram showing a manufacturing method related to one embodiment of the present invention;

FIG. 14B is a cross-sectional diagram showing a manufacturing method related to one embodiment of the present invention;

DESCRIPTION OF EMBODIMENTS

Figure 1:
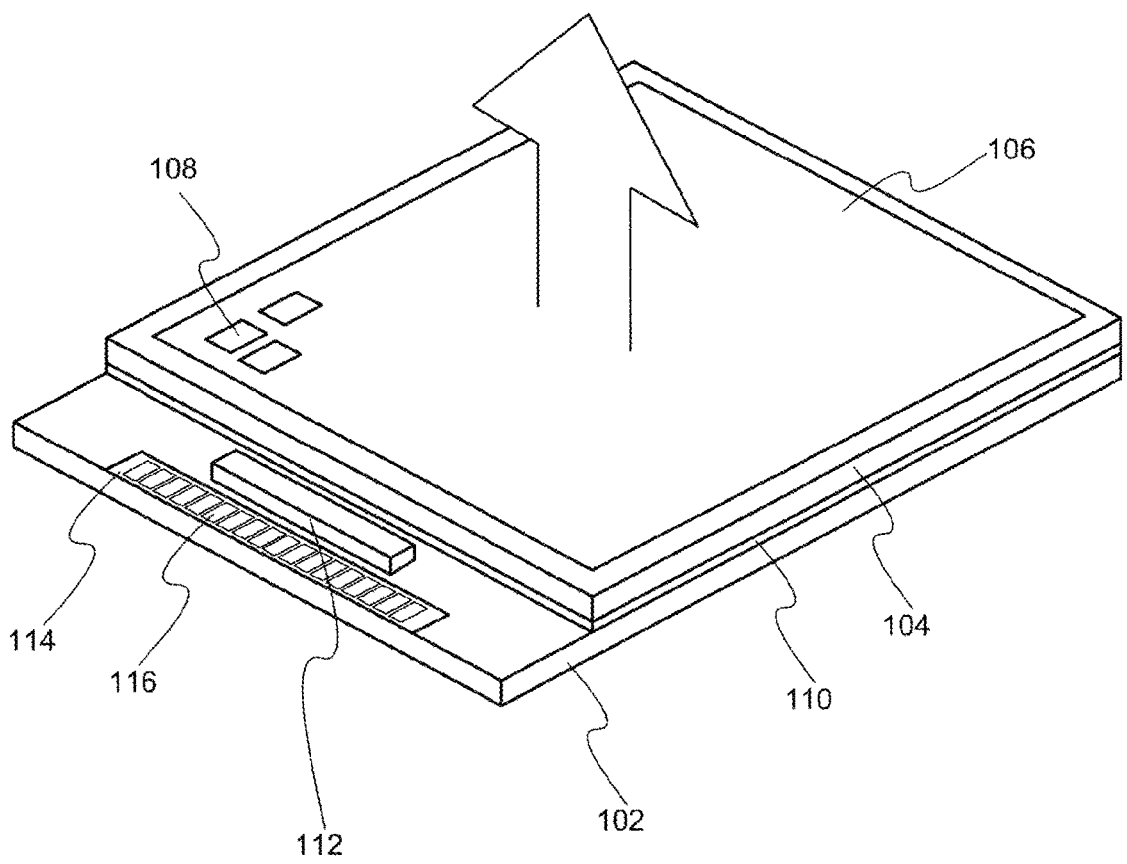
FIG. 1 is a perspective diagram showing an approximate structure of a display device related to one embodiment of the present invention.

A display device related to a number of embodiments of the present invention is explained in detail below while referring to the diagrams. However, it is possible to perform the present invention using many different forms, and the present invention should not be limited to the content described in the embodiments exemplified herein. In the embodiments of the present invention, although an organic EL display device is particularly exemplified as a suitable application example, the present invention is not limited to an organic EL display device.

Although the width, thickness and shape of each component are shown schematically compared to their actual form in order to better clarify explanation, the drawings are merely an example and should not limit an interpretation of the present invention. In addition, the dimensions ratios in the drawings may be different to actual ratios for the purpose of explanation and a part of the structure may be omitted from the drawings. In the specification and each drawing, the same reference symbols are attached to similar elements and elements that have been mentioned in previous drawings, and therefore a detailed explanation may be omitted where appropriate.

In the present specification, in the case where certain parts or regions are given as [above (or below)] other parts or regions, as long as there is no particular limitation, these include parts which are not only directly above (or directly below) other parts or regions but also in an upper direction (or lower direction). That is, in the case where certain parts or regions are given as [above (or below)] other parts or regions, other structural elements may be included between other parts or regions in an upper direction (or lower direction).

First Embodiment

FIG. 1 is a perspective diagram showing an approximate structure of a display device 100 related to the present embodiment. An approximate structure of the display device 100 related to the present embodiment is explained while referring to FIG. 1. The display device 100 is arranged with a display region 106 in a first substrate 102. The display region 106 is formed by arranging a plurality of pixels 108. A second substrate 104 is arranged as a sealing material on the upper surface of the display region 106. The second substrate 104 is fixed to the first substrate 102 by a sealing member 110 which encloses the display region 106. The display region 106 formed in the first substrate 102 is sealed so that it is not exposed to air by the second substrate 104 which is a sealing material and the sealing member 110. By such a sealing structure, degradation of a light emitting element arranged in a pixel is suppressed. Furthermore, although a structure is explained here in which the sealing member 110 enclosing the display region 106 is used when fixing the second substrate 104, the present embodiment is not limited to this structure and the sealing member 110 is not always necessary such as in the case where the second substrate 104 is fixed by another means.

Figure 2:
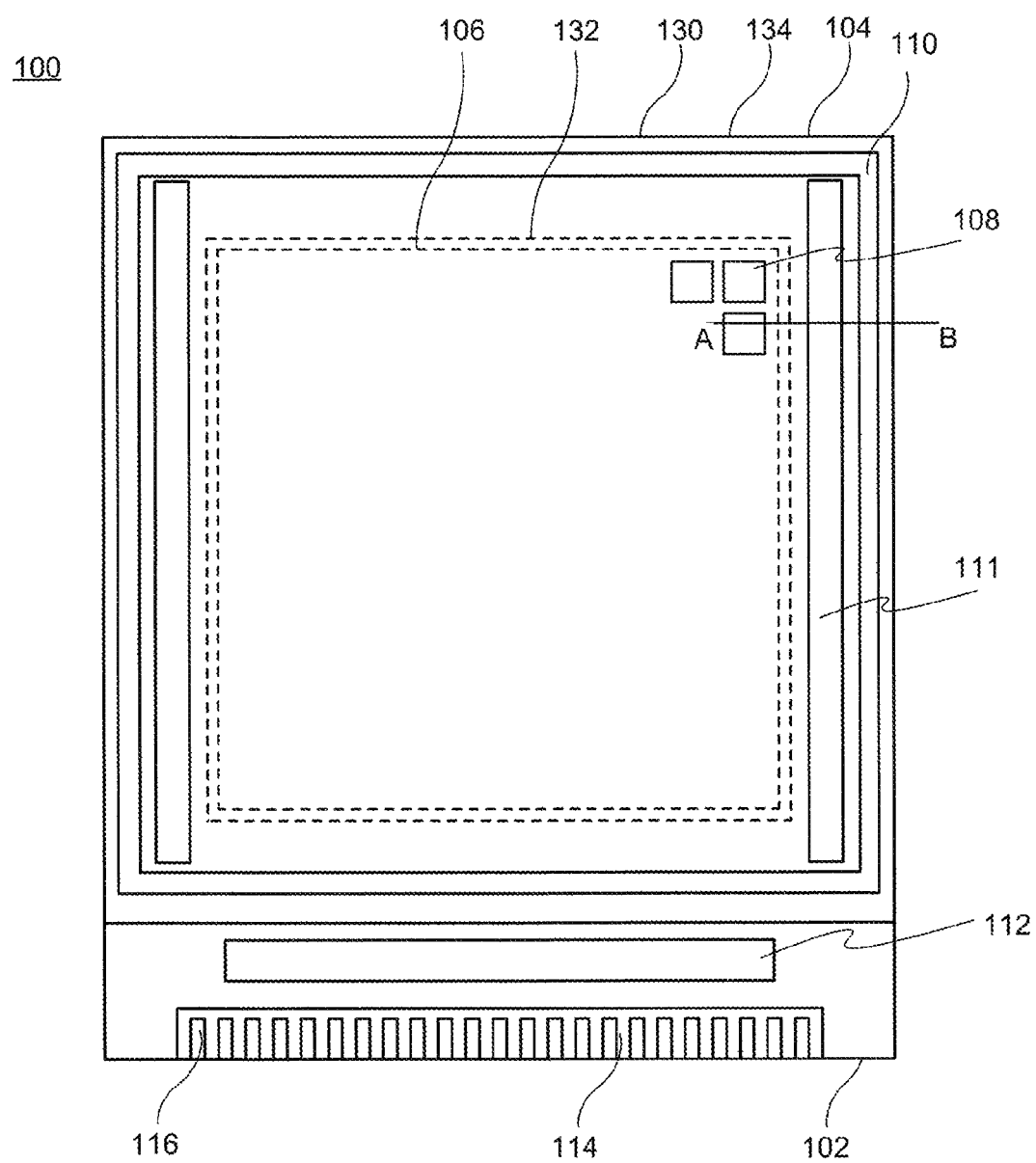
FIG. 2 is a planar view diagram showing an approximate structure of a display device related to one embodiment of the present invention.
Figure 3:
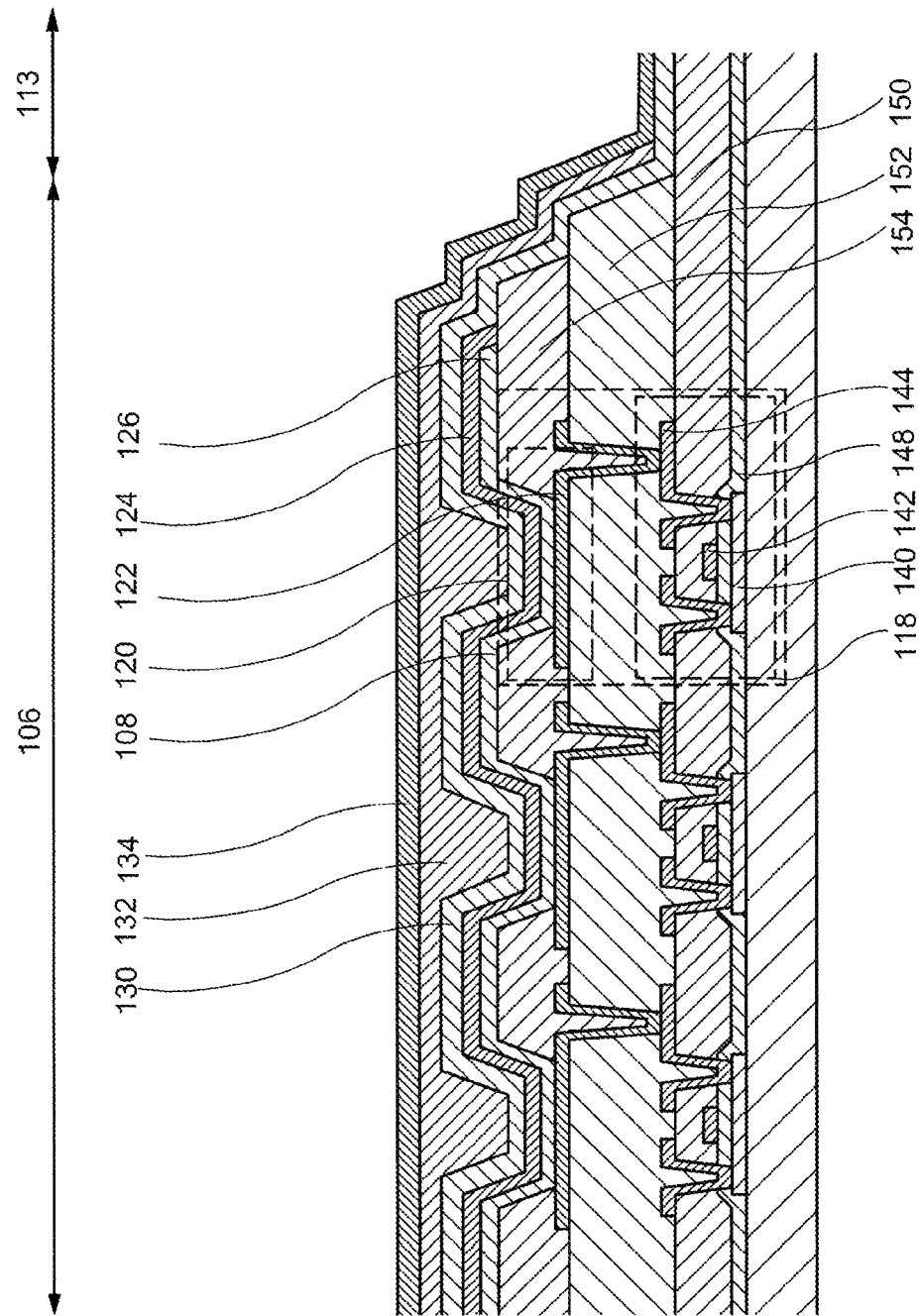
FIG. 3 is a cross-sectional diagram showing an approximate structure of a display region manufactured using a manufacturing method related to one embodiment of the present invention.

An approximate structure of the display device 100 related to the present embodiment is explained while referring to FIG. 2 and FIG. 3. FIG. 2 is a planar view diagram showing an approximate structure of the display device 100 manufactured using a manufacturing method related to the present embodiment. FIG. 3 is a cross-sectional diagram showing an approximate structure of the display device 100 manufactured using a manufacturing method related to the present embodiment.

As is shown in FIG. 2, the display device 100 related to the present embodiment is arranged with a display region 106 forming a display screen above the first substrate 102. A terminal region 114 is arranged at one end of the first substrate 102. The terminal region 114 is arranged at the outer side of the second substrate 104. The terminal region 114 is formed by a plurality of connection terminals 116. A connection terminal 116 forms a connection point with a wiring substrate for connecting devices which output an image signal or a power source and the display device 100. This connection point in the connection terminal 116 is exposed to the exterior. A first drive circuit 111 and second drive circuit 112 which output an image signal input from the terminal region 114 to the display region 106 are arranged on the first substrate 102. In the present embodiment, the first drive circuit 111 is arranged at the inner side of the second substrate 104 and the second drive circuit 112 is arranged at the outer side of the second substrate 104.

The display region 106, the first drive circuit 111 and the second drive circuit 112 are respectively connected by wiring. In addition to a pixel 108, the display region 106 is arranged with wiring called a scanning signal line and image signal line. Each pixel 108 of the display region 106 is connected with the first drive circuit 111 and second drive circuit 112 by this wiring. For example, the first drive circuit 111 is a drive circuit which outputs a scanning signal to the display region 106 and the second drive circuit 112 is a drive circuit which outputs an image signal to the display region 106.

As is shown in FIG. 3, the display region 106 includes a circuit element. A circuit element layer in the present embodiment has a multi-layer structure including a semiconductor layer 140, a gate insulation layer 148, a gate electrode 142, a first insulation layer 150, a source/drain electrode 144, a second insulation layer 152, an individual pixel electrode 122, a third insulation layer 154, a light emitting layer 126 and a common pixel electrode 124. Each of the plurality of pixels 108 of the display region 106 includes a transistor 118 and a light emitting element 120. The transistor 118 controls the light emission of the light emitting element 120.

The transistor 118 has a structure in which the semiconductor layer 140, gate insulation layer 148 and gate electrode 142 are stacked. The semiconductor layer 140 is formed by amorphous or polycrystalline silicon or by an oxide semiconductor and the like. The source/drain electrode 144 is arranged in an upper layer of the gate electrode 142 interposed by the first insulation layer 150. The second insulation layer 152 is arranged in an upper layer of the source/drain electrode 144 as a levelling layer. In addition, the light emitting element 120 is arranged on an upper surface of the second insulation layer 152. The second insulation layer 152 has an almost flat surface by burying concave and convex parts of the first insulation layer 150 that accompany the shape of a contact hole arranged in the source/drain electrode 144 and first insulation layer 150, and the gate electrode 142 and semiconductor layer 140. The second insulation layer 152 may also have a flat surface formed by performing an etching process of a surface of an inorganic insulation layer and/or performing a chemical mechanical polishing process, or a leveled flat surface obtained by coating or depositing a composition including a precursor such as acrylic or polyimide and the like.

The light emitting element 120 has a structure in which an individual pixel electrode 122 and a common pixel electrode 124 arranged opposing the individual pixel electrode 122 sandwich a light emitting layer 126. The individual pixel electrode 122 is arranged independently for each pixel 108 and is connected with each transistor 118 respectively. The common pixel electrode 124 is applied with a common potential across a plurality of pixels. However, the present embodiment is not limited thereto and the common pixel electrode 124 may be arranged separately independent from an adjacent pixel for each or all of the pixels. The light emitting element 120 is a terminal element and light emission is controlled by controlling a potential between the individual pixel electrode 122 and the common pixel electrode 124. A third insulation layer 154 is arranged between two adjacent pixels 108. An end part of the third insulation layer 154 is arranged to cover a periphery edge part of the individual pixel electrode 122. Since the third insulation layer 154 prevents short-circuits with the common pixel electrode 124 at an end part of the individual pixel electrode 122 and insulates adjacent pixels 108, it is preferred that the third insulation layer 154 is formed from an insulation material. For example, it is preferred that an organic material such as polyimide or acrylic or an inorganic material such as silicon oxide and the like are used for forming the third insulation layer 154.

Since the range of formation area of the second insulation layer 152, third insulation layer 154 and common pixel electrode 124 which are upper layers from the first insulation layer 150 becomes smaller by steps within the display region 106, an end part from the second insulation layer 152 to the common pixel electrode 124 may be stacked in a step shape at an end part of the display region 106. That is, the height of a circuit element layer within the display region 106 has a step shape and an end part may be formed in a step shape according to the height of each of the second insulation layer 152, third insulation layer 154 and common pixel electrode 124 respectively.

The display device 100 shown in the present embodiment has what is called a top-emission type structure in which light emitted by the light emitting element 120 is emitted to the common pixel electrode 124 side. Although a top-emission type structure is exemplified in the present embodiment, the present embodiment is not limited thereto and what is called a bottom-emission type structure can be applied in which light is emitted to the individual pixel electrode 122 side. The individual pixel electrode 122 is preferred to be formed from a metal with high reflectance in order to reflect light emitted by the light emitting layer 126 to the common pixel electrode 124 side. Alternatively, a structure in which the individual pixel electrode 122 is formed including a light reflecting surface by stacking a metal film and a transparent conductive film is also possible. On the other hand, the common pixel electrode 124 is preferred to be formed from a transparent conductive film such as ITO (Indium oxide added with tin) or IZO (indium oxide added with zinc) which have translucency and conductivity in order to allow light emitted by the light emitting layer 126 to pass through. Alternatively, the common pixel electrode 124 may be formed using a metal film to a thickness through which emitted light can pass through Although not shown in FIG. 3, the first drive circuit 111 also includes a circuit element. For example, in FIG. 7 and FIG. 8A to FIG. 8D, a signal processing circuit is formed in the first drive circuit 111 from a transistor having the same structure as the transistor 118 arranged in the display region 106. An end part of the second insulation layer 152 and third insulation layer 154 at an end part of the first drive circuit 111 may also be stacked in a step shape respectively. However, the second insulation layer 152 does not have to be present in the first drive circuit 111 in FIG. 7 and FIG. 8A to FIG. 8D.

A sealing film is arranged in an upper part of the display region 106. For example, in an organic EL display device which uses an organic EL element as the light emitting element 120, since the organic EL layer is extremely weak to water, light emission defects called dark spots can occur when water infiltrates the interior of a panel from the exterior and reaches the organic EL layer. Therefore, the sealing film is arranged to cover a circuit element of the display region 106. A sealing film at an upper part of the display region 106 in the present embodiment has a stacked structure of three layers and is arranged from the bottom layer side with a first insulation film 130, second insulation film 132 and third insulation film 134. The first insulation film 130, second insulation film 132 and third insulation film 134 all are arranged to cover a circuit element of the display region 106.

It is possible to use an inorganic insulation material or an organic insulation material as the first insulation film 130. It is preferred that a film with high water blocking properties is used as the first insulation film 130 and use of an inorganic insulation layer is particularly preferred. For example, in the case where an inorganic insulation material is used, it is possible to use a film such as silicon oxide ($SiO_x$), silicon nitride ($Si_xN_y$), silicon oxynitride ($SiO_xN_y$), silicon nitride oxide ($SiN_xO_y$), aluminum oxide ($Al_xO_y$), aluminum nitride ($Al_xN_y$), aluminum oxynitride ($Al_xO_yN_z$) and aluminum nitride oxide ($Al_xN_yO_z$) and the like (x, y and z are arbitrary). At this time, a single layer of just the first insulation film 130 may not be sufficiently used as a cover film due to concave and convex parts caused by the light emitting element 120 and the like within the display region 106 and a water transport path is sometimes produced.

Thus, the second insulation film 132 is arranged as a second layer in order to secure high flattening properties. It is possible to use an organic insulation material such as a polyimide resin, acrylic resin, epoxy resin, silicone resin, fluororesin and siloxane resin and the like as the second insulation film 132. As is shown in FIG. 3, the second insulation film 132 is formed to cover the display region 106. That is, an end part of the second insulation film 132 is located at an outer periphery part 113 of the display region 106.

The third insulation film 134 is arranged above the second insulation film 132 with improved flattening properties. It is possible to provide the third insulation film 134 with high covering properties due to flattening of the second insulation film 132 and suppress the production of a water transport path. It is possible to use an inorganic insulation material or an organic insulation material as the third insulation film 134. The third insulation film 134 is preferred to be a film with particularly high water blocking properties, and the use of an inorganic insulation material such as silicon nitride for example is preferred. Prevention of water infiltration can be expected by a stacked structure of the organic insulation layer and inorganic insulation layer described above.

The outer periphery part 113 is arranged in an outer periphery of the display region 106. An end part of the second insulation film 132 is arranged within the outer periphery part 113. On the other hand, the first insulation film 130 and third insulation film 134 are both arranged on approximately the entire surface of the first substrate 102. That is, a structure is adopted in which the first insulation film 130 and third insulation film 134 cover the second insulation film 132 at an end part of the insulation films stacked in three layers. As is shown in FIG. 2 and FIG. 3, the first insulation film 130 and third insulation film 134 are larger than the second insulation film 132 and the first insulation film 130 and third insulation film 134 contact at an outer side of the second insulation film 132. By adopting such a structure, an end part of the second insulation film 132 in particular is prevented from being exposed. In the case where an organic insulation material is used as the second insulation film 132, when the end part thereof is exposed, it is likely to form an infiltration path for water to infiltrate from the exterior. There is concern that water infiltrating from an end part of the second insulation film 132 is transported to the light emitting element 120 which decreases the lifetime of the display device 100. As a result, it is necessary that an end part of an organic insulation layer is covered by an inorganic insulation layer. This type of structure is also called a water blocking region.

Figure 4:
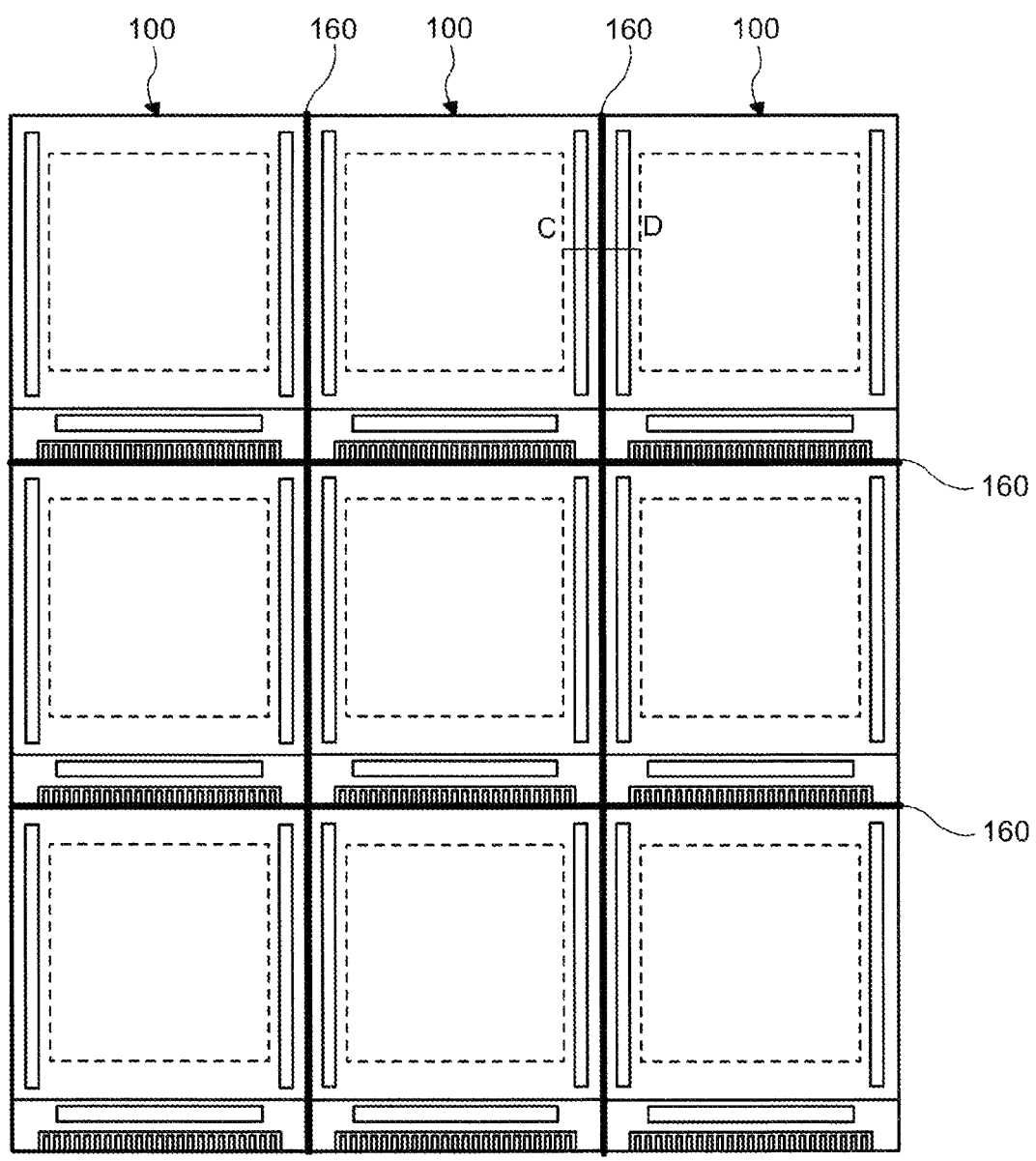
FIG. 4 is a planar view diagram showing a manufacturing method of a display device related to one embodiment of the present invention.

FIG. 4 is a planar view diagram showing a manufacturing method of a display device related to one embodiment of the present invention. Each circuit element in a plurality of display devices in the present embodiment is formed simultaneously above the first substrate 102 which is a multiple panel substrate. The first insulation film 130 and third insulation film 134 which are sealing films are formed at once on approximately the entire surface of the first substrate 102. The second insulation film 132 which is a sealing film is formed above each display region 106. A cutting site 160 is arranged at a boundary region of each display panel. Each display panel is obtained by cutting the first substrate 102 at the cutting site 160. Each display panel is sealed so that the display region 106 is not exposed to air by the second substrate 104 which is a sealing material and the sealing member 110 and the display device 100 related to the present embodiment is obtained. Although a structure is explained here in which the sealing member 110 enclosing the display region 106 is used when fixing the second substrate 104, the present embodiment is not limited to this structure and the sealing member 110 is not always necessary such as in the case where the second substrate 104 is fixed by another means.

FIG. 5A is a cross-sectional diagram showing an approximate structure of a cutting site in a manufacturing method related to one embodiment of the present invention. As is shown in FIG. 5A, a sealing region 115 is arranged at the boundary region of each display panel. The sealing region 115 includes a bump part 128 at the cutting site 160. The bump part 128 in the present embodiment is formed by a circuit element layer arranged in the display region 106 and the first drive circuit 111. However, the present embodiment is not limited thereto and the bump part 128 may be formed separately from a circuit element. The bump part 128 is formed with a convex shape which protrudes from the first substrate 102 by stacking each layer in the same range. In this way, a large step difference is formed compared to the end part of the display region 106 and first drive circuit 111. That is, a large step difference is formed by the bump part 128 and an adjacent region. Furthermore, although a step difference between the bump part 128 and an adjacent region is shown perpendicularly in FIG. 5A, the present embodiment is not limited thereto. A shape having an inclined surface is also possible. In addition, the height of a step difference between the bump part 128 and an adjacent region is preferred to be 2 μm or more. By providing such a height, it is possible to form a stepwise break of the first insulation film 130 and the third insulation film 134. Here, a stepwise break shows a discontinuous state of the first insulation film 130 and/or third insulation film 134 with respect to a step difference of an underlayer surface by that step difference part.

Figure 5B:
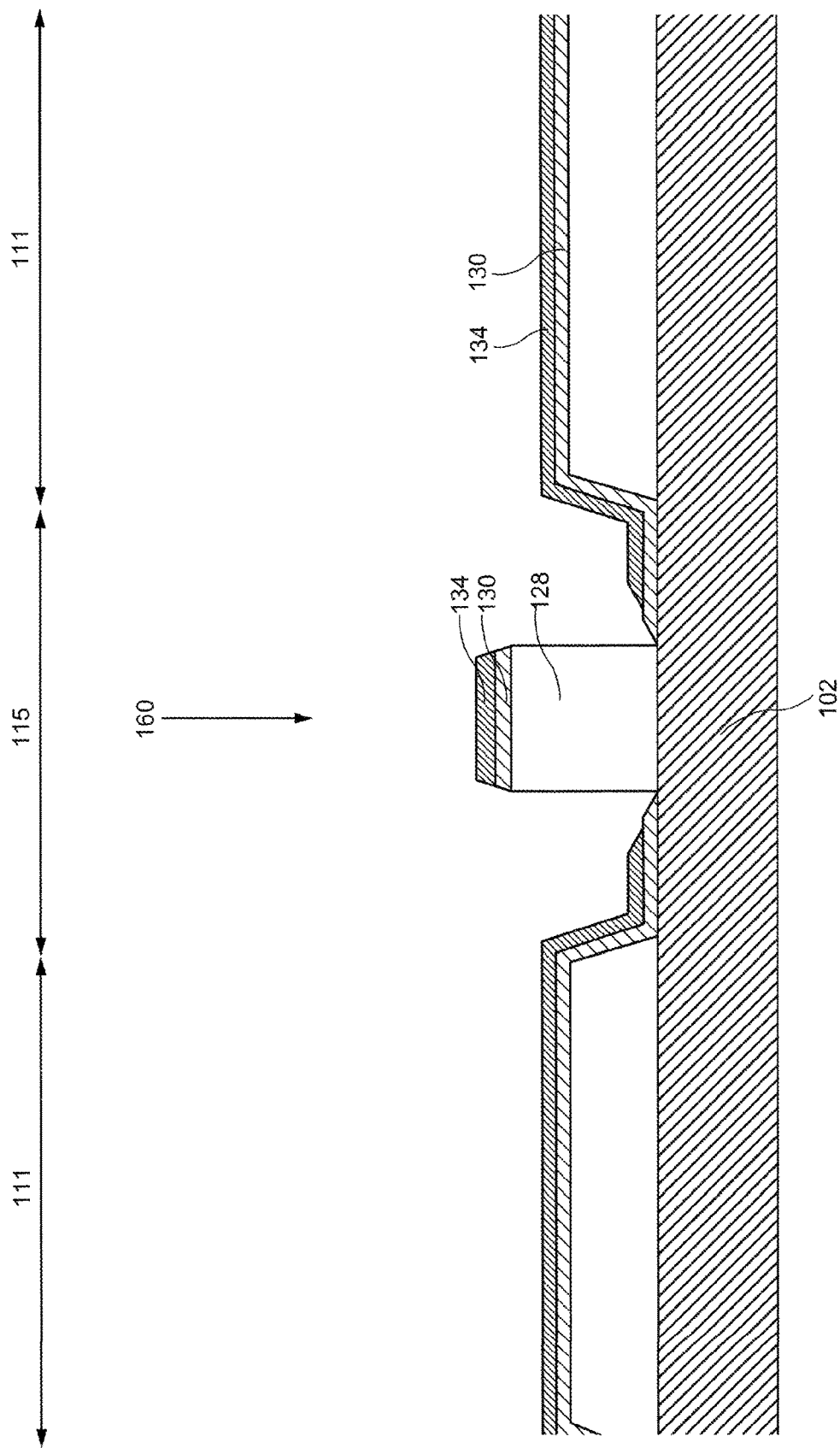
FIG. 5B is a cross-sectional diagram showing an approximate structure of a cutting site in a manufacturing method related to one embodiment of the present invention.

In the present embodiment, a sealing film in the sealing region 115 has a stacked structure of two layers arranged with a first insulation film 130 and third insulation film 134 from the bottom layer side. In the sealing region 115, the two layers of the first insulation film 130 and third insulation film 134 are both arranged above the bump part 128 and an adjacent region. However, the two layers of the first insulation film 130 and third insulation film 134 are separated between a region adjacent to the bump part 128 and an upper surface of the bump part 128. There is a large step difference between the bump part 128 and an adjacent region and as a result the first insulation film 130 and third insulation film 134 formed at once on approximately the entire surface of the display device are not formed on a side surface of the bump part 128 in the sealing region 115. In FIG. 5A, an end part of the first insulation film 130 and third insulation film 134 in the sealing region 115 are broken in a perpendicular direction in both a region adjacent to the bump part 128 and above the bump part 128. However, the present embodiment is not limited thereto, and as is shown in FIG. 5B, an end part of the first insulation film 130 and third insulation film 134 in the sealing region 115 may also have a step shape or a shape having an inclined surface the thickness of which decreases by such steps. In addition, the shape of the end part of the first insulation film 130 and third insulation film 134 in the sealing region 115 may each be different or be a combination of different shapes. In particular, by providing the end part of the first insulation film 130 and third insulation film 134 in a region adjacent to the bump part 128 with a step shape or a shape having an inclined surface the thickness of which decreases by such steps, it is possible to suppress the first insulation film 130 and third insulation film 134 from contacting or coming close to a side surface of the bump part 128, and it is possible to prevent stress applied when individually cutting or external stress from producing micro-cracks in the first insulation film 130 and third insulation film 134 covering the display region 106.

Figure 6:
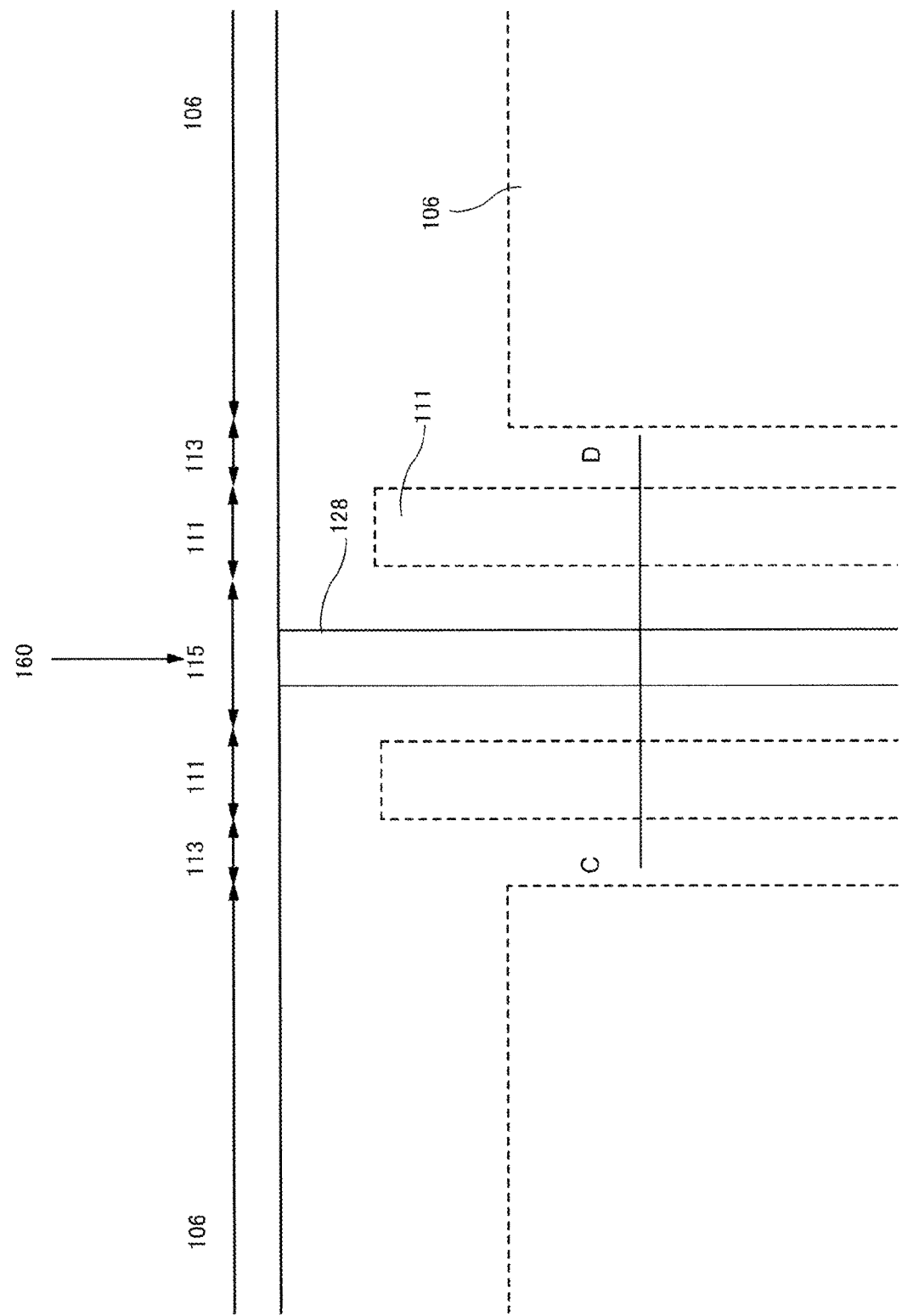
FIG. 6 is a top view diagram showing an approximate structure of a cutting site in a manufacturing method related to one embodiment of the present invention.

FIG. 6 is a top view diagram showing an approximate structure of a cutting site in a manufacturing method related to one embodiment of the present invention. As is shown in FIG. 6, the sealing region 115 includes the bump part 128 on a cutting site 160. In the sealing region 115, the two layers of the first insulation film 130 and third insulation film 134 are both arranged above the bump part 128 and in an adjacent region. However, the two layers of the first insulation film 130 and third insulation film 134 are broken between a region adjacent to the bump part 128 and above the bump part 128. There is a large step difference between the bump part 128 and an adjacent region 128 and as a result the first insulation film 130 and third insulation film 134 which are formed at once on approximately the entire surface of a display device are in a discontinuous state at both sides of the bump part 128 in the sealing region 115. Furthermore, an end part of the first insulation film 130 and third insulation film 134 in the sealing region 115 may be broken in a perpendicular direction in the sealing region 115 or may also have a step shape or a shape having an inclined surface at each step.

In this way, when a multiple panel substrate is separated into individual cut, by cutting the top part of a bump part arranged at a boundary region of each display device, it is possible to prevent micro-cracks in the first insulation film 130 and third insulation film 134 which easily occur when cutting from developing in the direction of the display region 106.

Figure 7:
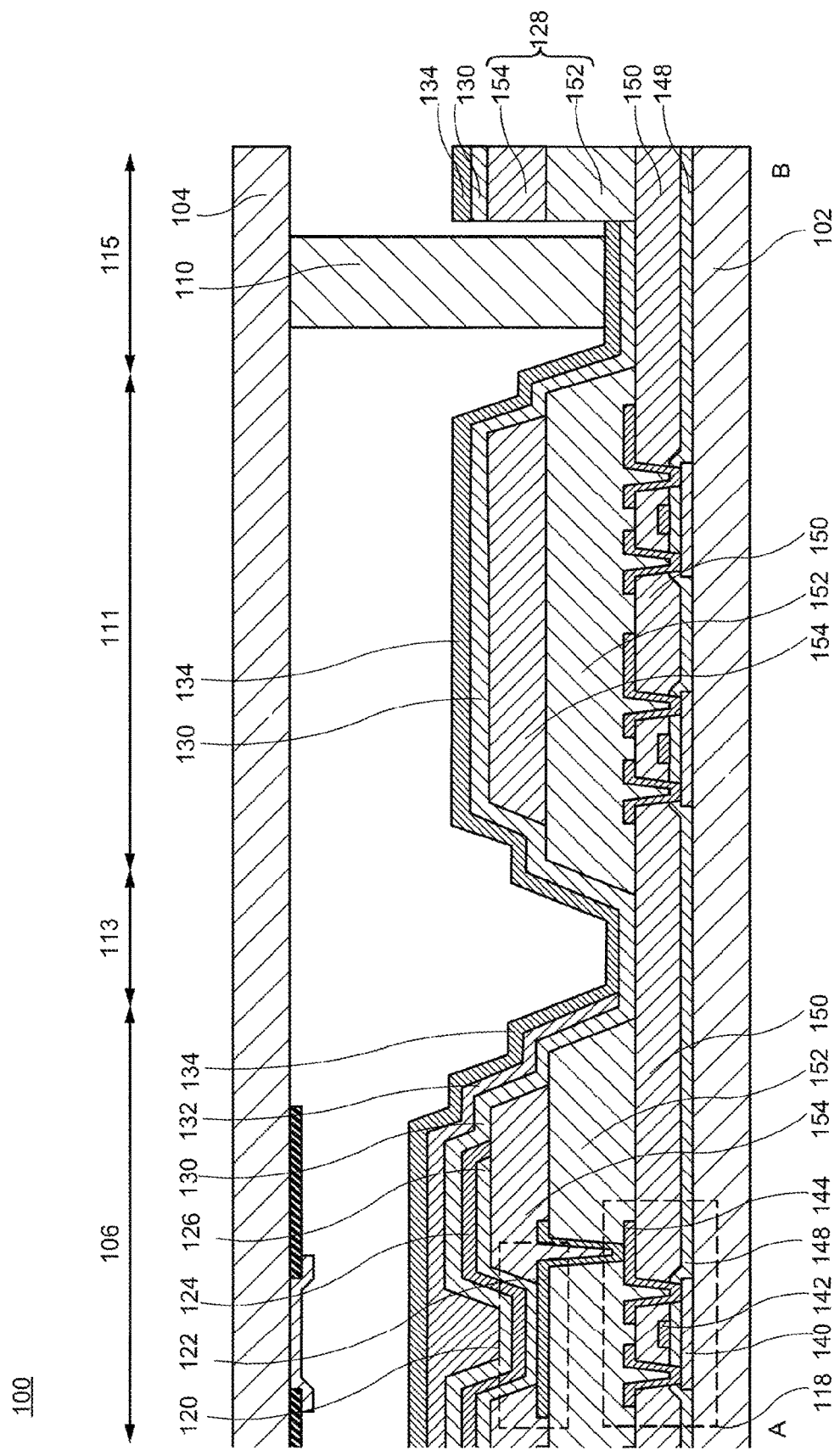
FIG. 7 is a cross-sectional diagram showing an approximate structure of a display device related to one embodiment of the present invention.

FIG. 7 is a cross-sectional diagram showing an approximate structure of the display device 100 related to the present embodiment. FIG. 7 shows a cross-sectional view of the display device 100 along the line A-B shown in FIG. 2. The display device 100 is arranged with the sealing region 115, first drive circuit 111, the outer periphery part 113 and display region 106 from the B side end part of the first substrate 102.

The sealing region 115 in the present embodiment is formed with the bump part 128 by the second insulation layer 152 which is an insulation layer arranged in the display region 106 and the third insulation layer 154. However, the present embodiment is not limited thereto, and the bump part 128 may also be formed by the semiconductor layer 140 arranged in the display region 106, the gate insulation layer 148, the first insulation layer 150 which are insulation layers, and the individual pixel electrode 122, the common pixel electrode 124, gate electrode 142 and source/drain electrode 144 which are conducting layers. The bump part 128 is formed in a convex shape protruding from the first substrate 102 by stacking each layer in the same range. In this way, a large step difference is produced between the bump part 128 and an adjacent region. Although a step difference between the bump part 128 and an adjacent region is shown perpendicularly in FIG. 7, the present embodiment is not limited thereto and a shape having an inclined surface is also possible.

The bump part 128 is arranged at an outer periphery of the display device. That is, the bump part 128 is arranged in an outer side end part of the sealing region. The bump part 128 is arranged at a boundary region of each panel in a manufacturing method for simultaneously forming a plurality of display panels by individually cutting a multiple panel substrate. Since the bump part 128, first insulation film 130 and third insulation film 134 arranged at the boundary region of each display panel are discontinuous from a circuit element layer arranged in the display region 106 and the first drive circuit 111, it is possible to prevent stress which is applied during individual cutting from developing in a direction of the display region 106. A part or the entire bump part 128 sometimes falls out when individually cutting a multiple panel substrate for example. In this case, at least the first insulation film 130 and the third insulation film 134 disappear from the outer periphery of the display device. That is, the first insulation film 130 and third insulation film 134 which cover a display region having the end part in the sealing region 115 are arranged in a region smaller than the outer periphery of the sealing region 115. It is possible to form a region in the outer periphery of the display device in which at least the first insulation film 130 and third insulation film 134 are not exist. Since the first insulation film 130 and third insulation film 134 which are sealing films disappear in an outer periphery of the display device which can easily be affected by external stress, it is possible to prevent micro-cracks from being produced in the first insulation film 130 and third insulation film 134 which cover the display region 106.

A sealing film is arranged in the display region 106, first drive circuit 111 and bump part 128. A three layer stacked structure is provided at an upper part of the display region 106 in the present embodiment, namely the first insulation film 130, second insulation film 132 and third insulation film 134 from the bottom layer side. The three layers of the first insulation film 130, second insulation film 132 and third insulation film 134 are each arranged so as to cover the display region 106.

The outer periphery part 113 is arranged between the display region 106 and the first drive circuit 111. An end part of the second insulation film 132 is arranged within the outer periphery part 113. On the other hand, the first insulation film 130 and the third insulation film 134 are each arranged on approximately the entire surface of the first substrate 102. That is, a structure is provided in which the first insulation film 130 and third insulation film 134 cover the second insulation film 132 at an end part of the insulation films stacked in three layers. By providing such a structure, the end part of the second insulation film 132 in particular is prevented from being exposed.

A sealing film in the first drive circuit 111 and the sealing region 115 (including the bump part 128) in the present embodiment has a two layer stacked structure arranged with the first insulation film 130 and third insulation film 134 from the bottom layer side. The two layers of the first insulation film 130 and third insulation film 34 are both arranged to cover the first drive circuit 111. In the sealing region 115, both of the two layers of the first insulation film 130 and third insulation film 34 are arranged above the bump part 128 and in an adjacent region. However, the two layers of the first insulation film 130 and third insulation film 34 are broken between a region adjacent to the bump part 128 and above the bump part 128. There is a large step difference between the bump part 128 and an adjacent region and as a result the first insulation film 130 and third insulation film 134 formed at once on approximately the entire surface of a display panel are in a discontinuous state at both side surfaces of the bump part 128 in the sealing region 115. In this way, when a multiple panel substrate is individually cut, by cutting the top of the bump part arranged at a boundary region of each display panel, it is possible to prevent micro-cracks in the first insulation film 130 and third insulation film 134 which can occur when cutting from developing. In FIG. 7, an end part of the first insulation film 130 and third insulation film 134 in the sealing region 115 are both broken perpendicularly in a region adjacent to the bump part 128 and above the bump part 128. However, the present embodiment is not limited thereto and an end part of the first insulation film 130 and third insulation film 134 in the sealing region 115 may also have a step shape or a shape having an inclined surface in which the film thickness decreases by each step. In addition, the shape of the end parts of the first insulation film 130 and third insulation film 134 in the sealing region 115 may each be different or may be a combination of different shapes.

The sealing member 110 is arranged in the sealing region 115. The sealing member 110 adheres the first substrate 102 with the second substrate 104. In the present embodiment, although the sealing member 110 is arranged in a region adjacent to the bump part 128 within the sealing region 115, the present embodiment is not limited thereto and the sealing member 110 may be arranged above the bump part 128 as long as it is within the sealing region 115. A region between the first substrate 102 and the second substrate 104 is blocked from the air by the sealing member 110 and the display region 106 is sealed therein. Although a structure was explained here in which the sealing member 110 which encloses the display region 106 is used when fixing the second substrate 104, the present embodiment is not limited to this structure and the sealing member 110 is not always necessary such as in the case where the second substrate 104 is fixed by another means.

As in the present embodiment, by adopting a sealing film structure stacked in three layers, it is possible to suppress water from infiltrating to the display region 106. By adopting a structure in which the first insulation film 130 and third insulation film 134 are broken within the sealing region 115, it is possible to prevent micro-cracks in an insulation film which can occur when cutting the first substrate 102 from developing and further suppress the infiltration of water. In this way, it is possible to provide a display device with high reliability. Here, by combining with a sealing structure using a conventional sealing member 110, it is possible to expect further improvement in water resistance and provide a display device with even higher reliability.

Manufacturing Method

Next, a manufacturing method of the display device 100 in the present embodiment is explained. FIG. 8A to FIG. 8D are cross-sectional diagrams showing a manufacturing method related to one embodiment of the present invention. FIG. 8A to FIG. 8D show a cross-section along the line C-D in FIG. 4. In the present embodiment, since it is possible to use an existing method for forming a circuit element layer, an explanation thereof is omitted. In FIG. 8A to FIG. 8D, a method for forming a sealing film in the first drive circuit 111 and the sealing region 115 is explained in further detail.

Figure 8A:
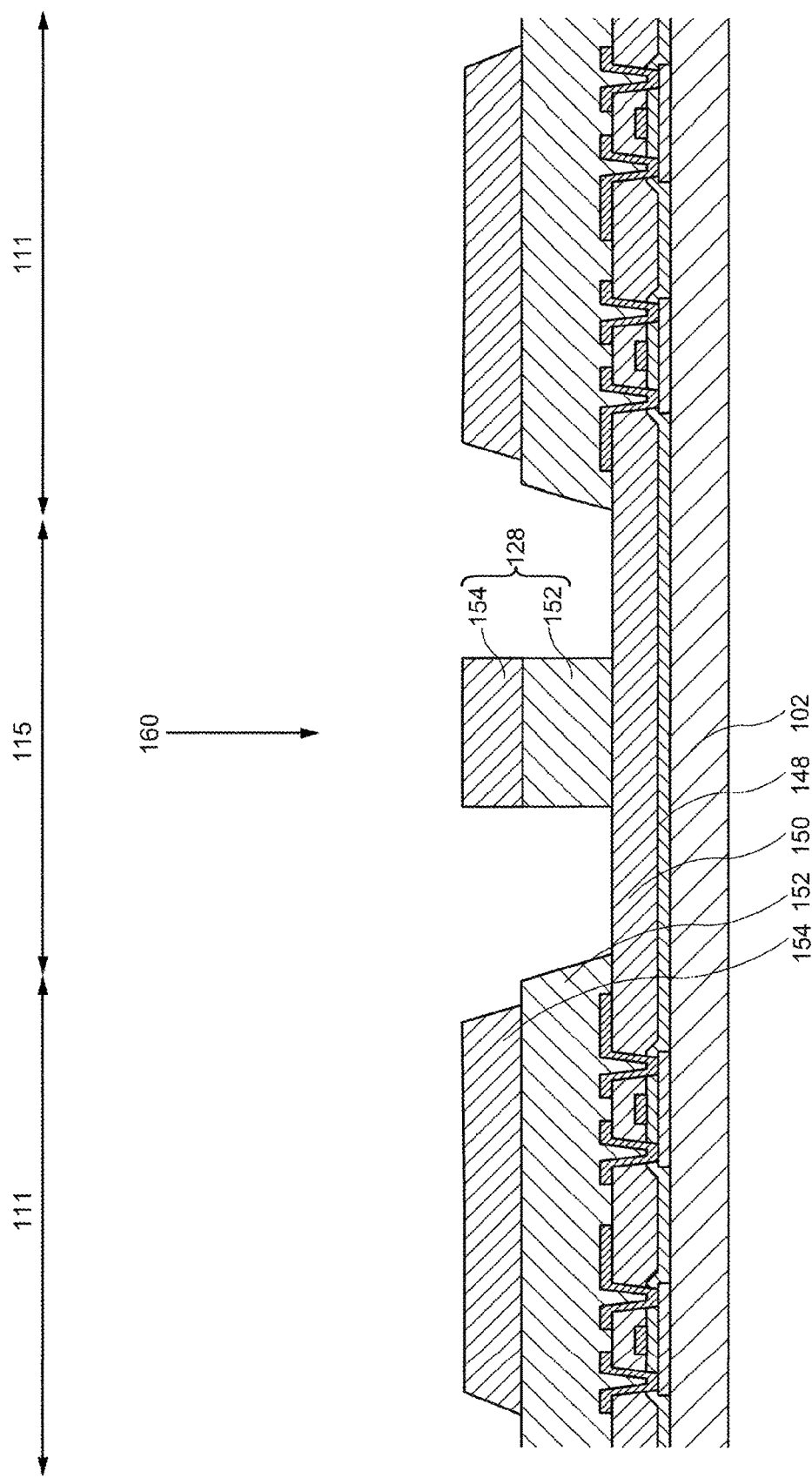
FIG. 8A is a cross-sectional diagram showing a manufacturing method related to one embodiment of the present invention.

FIG. 8A is a cross-sectional diagram of a first substrate 102 formed with each circuit element layer in the first drive circuit 111 and sealing region 115. Although not shown in FIG. 8A, a circuit element layer including a semiconductor layer, an insulation layer and a conducting layer is formed in the display region 106 and the first drive circuit 111. An end part of the circuit element layer in the display region 106 and the first drive circuit 111 may be respectively stacked in a step shape. A bump part 128 is formed by a second insulation layer 152 and third insulation layer 154 which are insulation layers arranged in the display region 106 and first drive circuit 111 in a cutting site 160 of the sealing region 115. A circuit element of the display region 106, a circuit element of the first drive circuit 111 and the bump part 128 of the sealing region 115 are formed by patterning. The bump part 128 is formed in a convex shape protruding from the first substrate 102 by stacking each layer within the same range. In this way, a large step difference is produced between the bump part 128 and an adjacent region. The bump part 128 is arranged on the outer periphery of a display panel. That is, the bump part 128 is arranged in a boundary region of each display panel. Furthermore, although a step difference between the bump part 128 and an adjacent region is shown perpendicularly in FIG. 8A, the present embodiment is not limited thereto and a shape having an inclined surface is also possible.

Next, the first insulation film 130 is formed. As is shown in FIG. 8B, the first insulation film 130 is formed on a film formation surface of the first substrate 102 formed with circuits. In the present embodiment, a silicon nitride film is formed using a plasma CVD method. The first insulation film 130 in the present embodiment is formed so as to cover the display region 106 and the first drive circuit 111. The first insulation film 130 is formed above the bump part 128 and in an adjacent region also in the sealing region 115. However, due to the convex shape of the bump part 128, the first insulation film 130 is broken between a region adjacent to the bump part 128 and above the bump part 128. A large step difference exists between the bump part 128 and an adjacent region and as a result the first insulation film 130 formed at once on approximately the entire surface of a display panel is not formed on a side surface of the bump part 128 in the sealing region 115. The first insulation film 130 in the sealing region 115 may be broken perpendicularly or may have a shape including an inclined surface.

Although not shown in FIG. 8A to FIG. 8D, next, the second insulation film 132 is formed above the display region 106. In the present embodiment, an acrylic resin film is formed using an inkjet method. The second insulation film 132 is formed so as to cover the display region 106. An end part of the second insulation film 132 at this time is arranged within an outer periphery part 113.

Figure 8C:
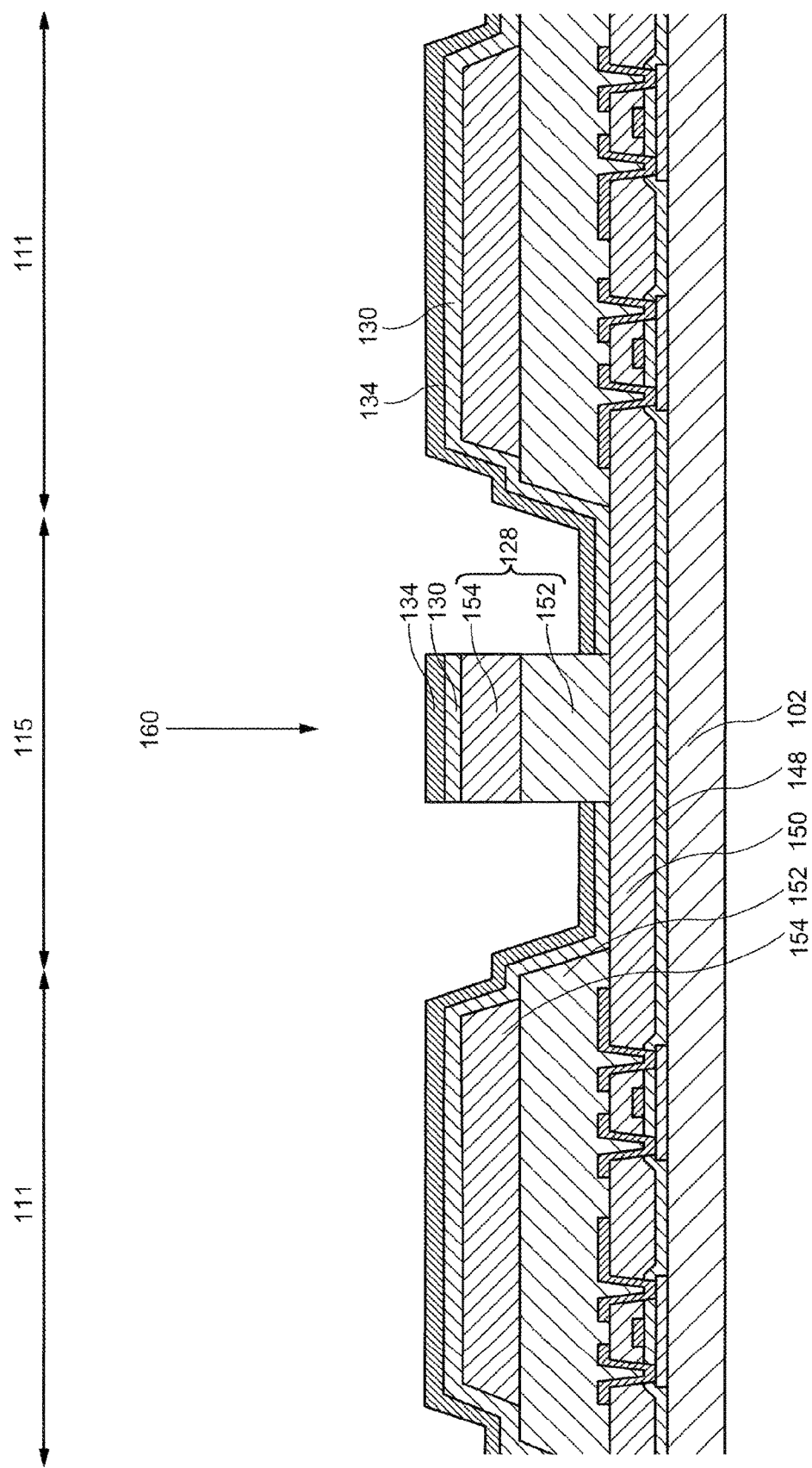
FIG. 8C is a cross-sectional diagram showing a manufacturing method related to one embodiment of the present invention.

Next, the third insulation film 134 is formed. As is shown in FIG. 8C, the third insulation film 134 is formed above the first insulation film 130 (and above the second insulation film 132). In the present embodiment, the third insulation film 134 is formed so as to cover the display region 106 and the first drive circuit 111. The third insulation film 134 is formed above the bump part 128 and in an adjacent region also in the sealing region 115. However, due to the convex shape of the bump part 128, the third insulation film 134 is broken between a region adjacent to the bump part 128 and above the bump part 128. A large step difference exists between the bump part 128 and an adjacent region and as a result the third insulation film 134 formed at once on approximately the entire surface of a display panel is not formed on a side surface of the bump part 128 in the sealing region 115. An end part of the third insulation film 134 in the sealing region 115 may be broken perpendicularly or may have a shape including an inclined surface.

Figure 8D:
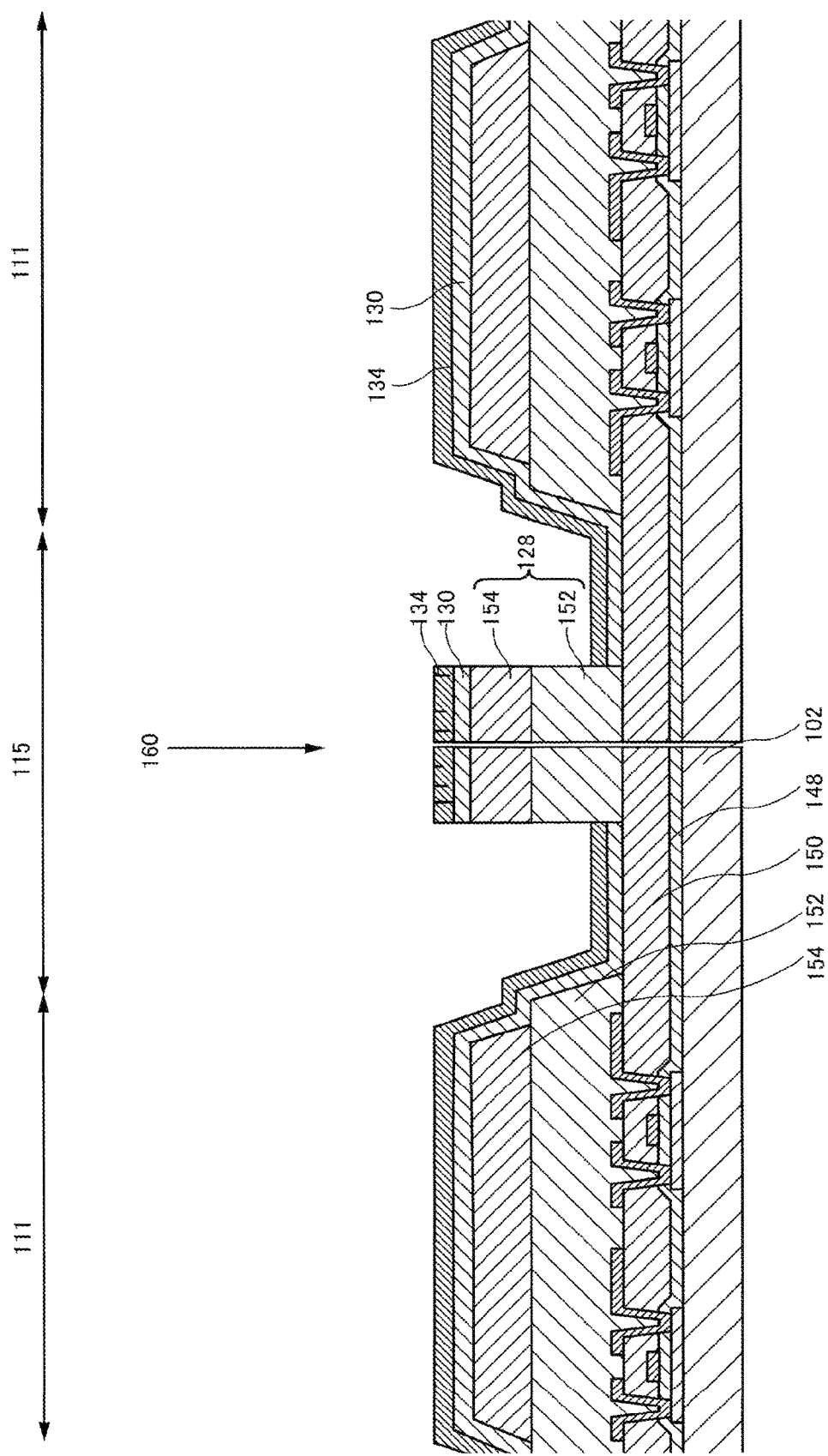
FIG. 8D is a cross-sectional diagram showing a manufacturing method related to one embodiment of the present invention.

Next, the first substrate 102 is cut at the cutting site 160. Here, a plurality of display panels formed at once above the first substrate 102 are individually cut. As shown in FIG. 8D, the bump part 128 is arranged in the cutting site 160. The top of the bump part 128 is cut when individually cutting the display panels. It is possible to use a scribe break using a scribing wheel, punch cutting, laser cutting or a combination of these as the cutting method.

When the first substrate 102 is cut at the cutting site 160, stress is applied to the first insulation film 130 and/or the third insulation film 134 and thereby micro-cracks may occur or each bump part may fall out. Furthermore, micro-cracks may develop by repeating transformation in the case of a flexible sheet display which may lead to a widening of a water infiltration path. Micro-cracks in the first insulation film 130 and/or third insulation film 134 which are sealing films become water infiltration paths and dark spots may be produced when they reach a light emitting element arranged in each pixel. In the present embodiment, the first insulation film 130 and third insulation film 134 arranged at the cutting site 160 are broken between the bump part 128 and an adjacent region in the sealing region 115. As a result, micro-cracks in the first insulation film 130 and third insulation film 134 above the bump part 128 which may occur during cutting can be prevented from developing in the direction of the display region 106.

The display device 100 shown in FIG. 7 is obtained by sealing each display panel which has been individually cut using the second substrate 104 using the sealing member 110. In the present embodiment, although the sealing member 110 is arranged in a region adjacent to the bump part 128 within the sealing region 115, the present embodiment is not limited thereto and may also be above the bump part 128 as long as it is within the sealing region 115. A region between the first substrate 102 and the second substrate 104 is blocked from the air by the sealing member 110 and the display region 106 is sealed therein. Although a structure was explained here in which the sealing member 110 which encloses the display region 106 is used when fixing the second substrate 104, the present embodiment is not limited to this structure and the sealing member 110 is not always necessary such as in the case where the second substrate 104 is fixed by another means.

As in the present embodiment, by adopting a sealing film structure stacked in three layers, it is possible to suppress water from infiltrating to a display region. By adopting a structure in which the first insulation film 130 and third insulation film 134 are broken within the sealing region 115, it is possible to prevent micro-cracks in an insulation film which can occur when cutting the first substrate 102 from developing and further suppress the infiltration of water. In this way, it is possible to provide a display device with high reliability. Here, by combining with a sealing structure using a conventional sealing member 110, it is possible to expect further improvement in water resistance and provide a display device with even higher reliability.

Second Embodiment

In the first embodiment, the bump part 128 in the sealing region 115 is formed in a convex shape in which each insulation layer is stacked. In the second embodiment, the bump part 128 is formed in an eave shape by further ashing the bump part 128. Since the structure of the display device 100 and a part of the manufacturing process are common in the present embodiment and the first embodiment, an overlapping explanation is omitted.

FIG. 9 is a cross-sectional diagram showing an approximate structure of a cutting site in a manufacturing method related to one embodiment of the present invention. As is shown in FIG. 9, the sealing region 115 is arranged in a boundary region of each display panel. The sealing region 115 includes the bump part 128 on the cutting site 160. The bump part 128 in the present embodiment is formed by a circuit element layer arranged in the display region 106 and the first drive circuit 111. However, the present embodiment is not limited thereto and the bump part 128 may be formed separately from a circuit element. The bump part 128 is formed in a convex shape protruding from the first substrate 102 by stacking each layer within the same range. The convex shaped bump part 128 is further ashed into an eave shape. In this way, a large step difference is formed compared to an end part of the display region 106 and the first drive circuit 111. That is, a large step difference is formed between the bump part 128 and an adjacent region. Furthermore, a side surface of the bump part 128 has a hollowed shape in the direction of the cutting site 160. Although the majority of the side surface of the bump part 128 is shown having a hollowed shaped in the direction of the cutting site 160 in FIG. 9, the present embodiment is not limited thereto and one part of the side surface of the bump part 128 may have a hollowed shape in the direction of the cutting site 160. It is preferred that the height of a step difference between the bump part 128 and an adjacent region is 2 μm or more. By providing such a height, it is possible to provide a step break of the first insulation film 130 and the third insulation film 134.

In the present embodiment, a sealing film in the sealing region 115 has a stacked structure of two layers and is arranged with the first insulation film 130 and third insulation film 134 from the bottom layer side. Both of the two layers of the first insulation film 130 and third insulation film 134 in the sealing region 115 are arranged above the bump part 128 and in an adjacent region. However, the two layers of the first insulation film 130 and third insulation film 134 are separated between a region adjacent to the bump part 128 and an upper surface of the bump part 18. A large step difference exists between the bump part 128 and an adjacent region and since the side surface of the bump part 128 has a hollowed shape in the direction of the cutting site 160, the first insulation film 130 and the third insulation film 134 which are formed at once on approximately the entire surface of a display panel are not formed on a side surface of the bump part 128 in the sealing region 115. In this way, by cutting the top of a bump part arranged in a boundary region of each display panel when individually cutting a multiple panel substrate, it is possible to prevent micro-cracks in the first insulation film 130 and third insulation film 134 which can occur during cutting from developing in the direction of the display region 106. In FIG. 9, an end part of the first insulation film 130 and third insulation film 134 in the sealing region 115 are both broken perpendicularly in a region adjacent to the bump part 128 and above the bump part 128. However, the present embodiment is not limited thereto and an end part of the first insulation film 130 and third insulation film 134 in the sealing region 115 may have a step shape or a shape having an inclined surface in which the film thickness decreases by each step. In addition, the shape of an end part of the first insulation film 130 and third insulation film 134 in the sealing region 115 may each be different or be a combination of different shapes. In particular, by providing an end part of the first insulation film 130 and third insulation film 134 in a region adjacent to the bump part 128 with a step shape or a shape having an inclined surface in which the film thickness decreases by each step, it is possible to suppress the first insulation film 130 and third insulation film 134 from contacting or coming close together at a side surface of the bump part 128, and it is possible to prevent stress applied when individually cutting or external stress from producing micro-cracks in the first insulation film 130 and third insulation film 134 which cover the display region 106.

Figure 10:
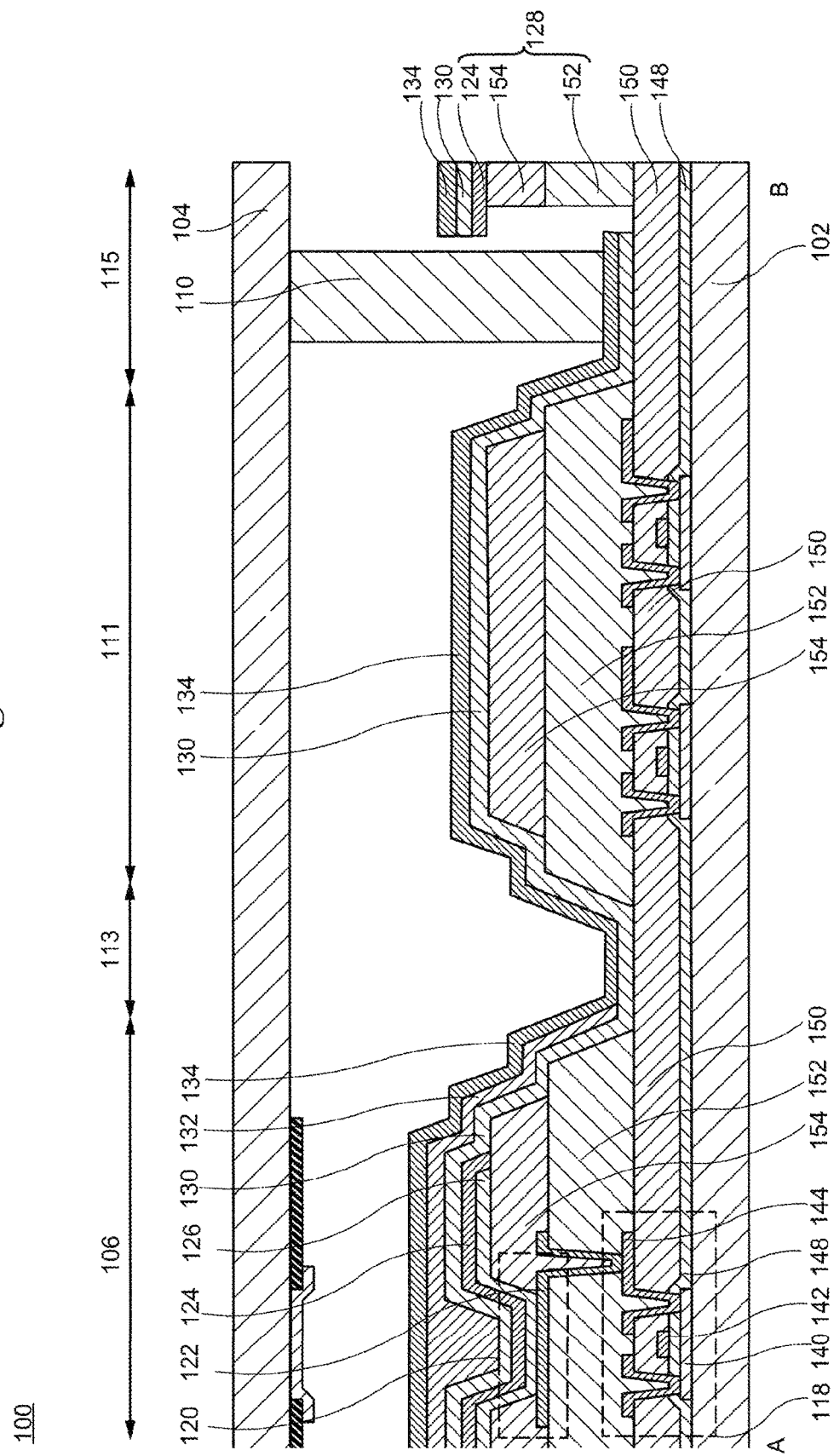
FIG. 10 is a cross-sectional diagram showing an approximate structure of a display device related to one embodiment of the present invention.

FIG. 10 is a cross-sectional diagram showing an approximate structure of the display device 100 related to the present embodiment. FIG. 10 shows a cross-section along the line A-B in FIG. 2. As is shown in FIG. 10, the display device 100 is arranged with the sealing region 115, first drive circuit 111, outer periphery part 113 and display region 106 from a B side end part of the first substrate 102.

In the sealing region 115 in the present embodiment, the bump part 128 is formed by the second insulation layer 152 and third insulation layer 154 which are insulation layers and a common pixel electrode 124 which is a conducting layer arranged in the display region 106. However, the present embodiment is not limited thereto and the bump part 128 may be formed by a semiconductor layer 140 arranged in the display region 106, an individual pixel electrode 122, a common pixel electrode 124, a gate electrode 142 and a source/drain electrode 144 and the like which are a conducting layer. The bump part 128 is formed in a convex shape protruding from the first substrate 102 by stacking each layer. Furthermore, the bump part 128 is formed by ashing the second insulation layer 152 and third insulation layer 154. As a result, in a display region side surface of the bump part 128, an end part of the common pixel electrode 124 is formed in an eave shape protruding further to the outer side than an end part of the second insulation layer 152 and third insulation layer 154. In this way, a large step difference exists between the bump part 128 and an adjacent region and a display region side surface of the bump part 128 is further formed into a hollowed shape in the direction of the cutting site 160. Although the majority of the side surface of the bump part 128 is shown as having a hollowed shape in the direction of the cutting site 160, the present embodiment is not limited thereto and one part of the side surface of the bump part 128 may have a hollowed shape in the direction of the cutting site 160.

The bump part 128 is arranged in an outer periphery of the display device. That is, the bump part 128 is arranged in an outer side end part of a sealing region. The bump part 128 is arranged in a boundary region of each panel in a manufacturing method for simultaneously forming a plurality of display panels by individually cutting a multiple panel substrate. Since the bump part 128, first insulation film 130 and third insulation film 134 arranged in a boundary region of each display panel are discontinuous between circuit element layers arranged in the display region 106 and the first drive circuit 111, it is possible to prevent stress applied when individually cutting developing in the direction of the display region 106. For example, a part or the entire bump part 128 may sometimes fall out when individually cutting a multiple panel substrate. In this case, at least the first insulation film 130 and third insulation film 134 disappear from an outer periphery of the display device. That is, it is possible to form a region in which at least the first insulation film 130 and third insulation film 134 are not exist in the outer periphery of the display device. Since the first insulation film 130 and third insulation film 134 which are sealing films disappear in an outer periphery of a display device which can be easily affected by external stress, it is possible to prevent micro-cracks from occurring in the first insulation film 130 and third insulation film 134 which cover the display region 106.

A sealing film is arranged in an upper part of the display region 106, the first drive circuit 111 and the bump part 128. A sealing film in an upper part of the display region 106 in the present embodiment has a stacked structure of three layers and is arranged with the first insulation film 130, second insulation film 132 and third insulation film 134 from the bottom layer side. An end part of the second insulation film 132 is arranged within the outer periphery part 113. On the other hand, the first insulation film 130 and third insulation film 134 are both arranged on approximately the entire surface of the first substrate 102. That is, at an end part of an insulation film stacked in three layers, the first insulation film 130 and third insulation film 134 have a structure covering the second insulation film 132.

A sealing film in the first drive circuit 111 and sealing region 115 (including the bump part 128) in the present embodiment has a stacked structure of two layers and is arranged with the first insulation film 130 and third insulation film 134 from the bottom layer side. Both the first insulation film 130 and third insulation film 134 are arranged to cover the first drive circuit 111. In the sealing region 115, the two layers of the first insulation film 130 and third insulation film 134 are both arranged above the bump part 128 and in an adjacent region. However, the two layers of the first insulation film 130 and third insulation film 134 are broken between a region adjacent to the bump part 128 and above the bump part 128. Furthermore, since a large step difference exists between the bump part 128 and an adjacent region and a side surface of the bump part 128 has a shape hollowed in the direction of the cutting site 160, the first insulation film 130 and third insulation film 134 formed at once on approximately the entire surface of a display panel are in a discontinuous state at both side surfaces of the bump part 128 in the sealing region 115. In this way, by cutting the top of the bump part arranged in a boundary region of each panel when individually cutting a multiple panel substrate, it is possible to prevent micro-cracks in the first insulation film 130 and third insulation film 134 which can occur when cutting from developing. In FIG. 10, an end part of the first insulation film 130 and third insulation film 134 in the sealing region 115 are both broken perpendicularly in a region adjacent to the bump part 128 and above the bump part 128. However, the present embodiment is not limited thereto and an end part of the first insulation film 130 and third insulation film 134 in the sealing region 115 may have a step shape or a shape having an inclined surface which decreases in film thickness by each step. In addition, the shape of the first insulation film 130 and third insulation film 134 in the sealing region 115 may each be different of a combination of different shapes.

The sealing member 110 is arranged in the sealing region 115. The sealing member 110 adheres the first substrate 102 with the second substrate 104. In the present embodiment, although the sealing member 110 is arranged in a region adjacent to the bump part 128 within the sealing region 115, the present embodiment is not limited thereto and may also be above the bump part 128 as long as it is within the sealing region 115. A region between the first substrate 102 and the second substrate 104 is blocked from the air by the sealing member 110 and the display region 106 is sealed therein. Although a structure was explained here in which the sealing member 110 which encloses the display region 106 is used when fixing the second substrate 104, the present embodiment is not limited to this structure and the sealing member 110 is not always necessary such as in the case where the second substrate 104 is fixed by another means.

As in the present embodiment, by adopting a sealing film structure stacked in three layers, it is possible to suppress water from infiltrating to the display region 106. By adopting a structure in which the first insulation film 130 and third insulation film 134 are broken within the sealing region 115, it is possible to prevent micro-cracks in an insulation film which can occur when cutting the first substrate 102 from developing and further suppress the infiltration of water. In this way, it is possible to provide a display device with high reliability. Here, by combining with a sealing structure using a conventional sealing member 110, it is possible to expect further improvement in water resistance and provide a display device with even higher reliability.

Manufacturing Method

Next, a manufacturing method of the display device 100 in the present embodiment is explained. FIG. 11A to FIG. 11E are cross-sectional diagrams showing a manufacturing method related to one embodiment of the present invention. FIG. 11A to FIG. 11E show a cross-section along the line C-D in FIG. 4. In the present embodiment, since it is possible to use an existing method for forming a circuit element layer, an explanation thereof is omitted. In FIG. 11A to FIG. 11E, a method for forming a sealing film in the first drive circuit 111 and the sealing region 115 is explained in further detail.

Figure 11A:
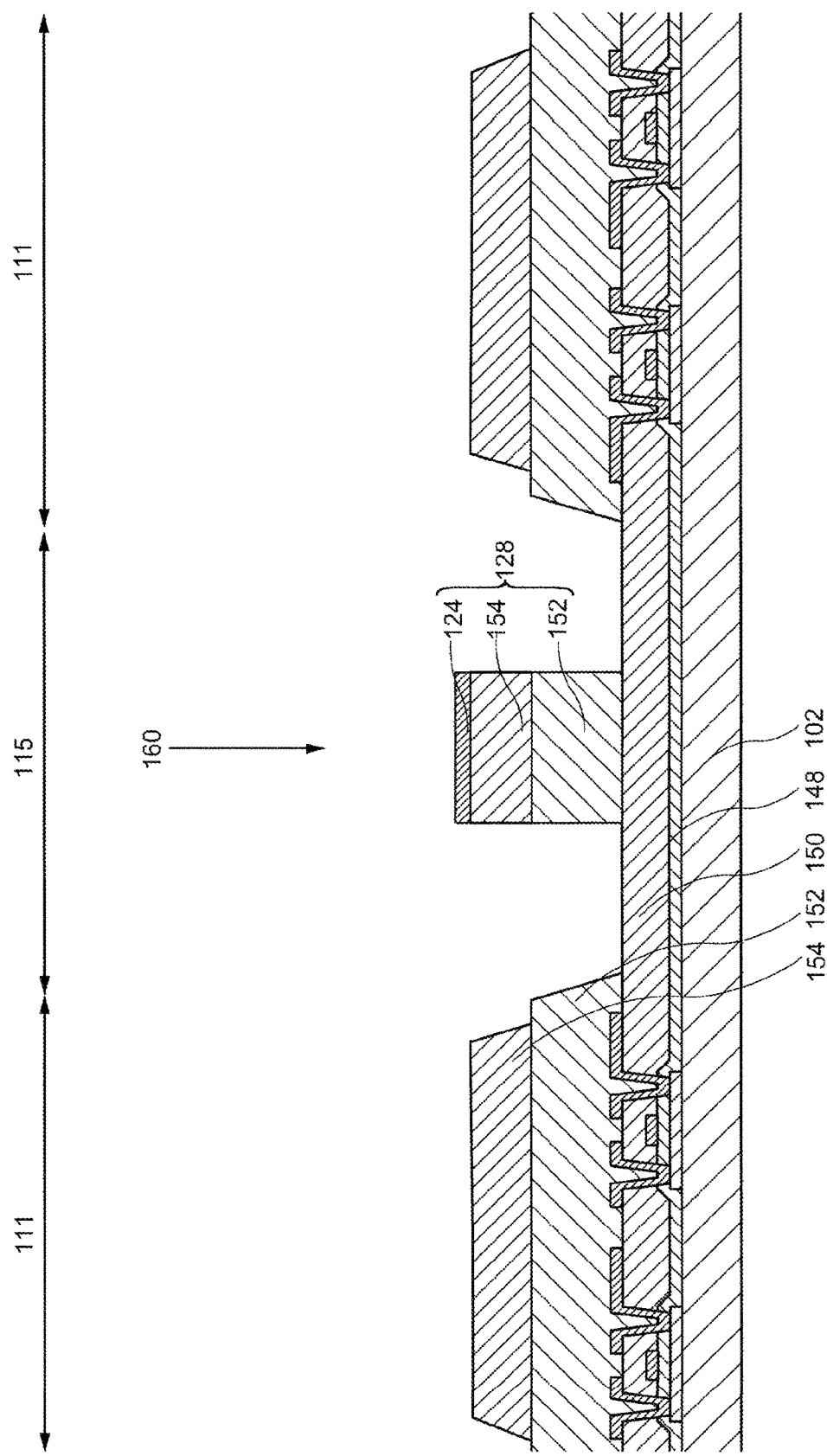
FIG. 11A is a cross-sectional diagram showing a manufacturing method related to one embodiment of the present invention.

FIG. 11A is a cross-sectional diagram of a first substrate 102 formed with each circuit element layer in the first drive circuit 111 and sealing region 115. Although not shown in FIG. 11A, a circuit element layer including a semiconductor layer, an insulation layer and a conducting layer is formed in the display region 106 and the first drive circuit 111. An end part of the circuit element layer in the display region 106 and the first drive circuit 111 may be respectively stacked in a step shape. A bump part 128 is formed by a second insulation layer 152 and third insulation layer 154 which are insulation layers and a common pixel electrode 124 which is a conducting layer arranged in the display region 106 and first drive circuit 111 in a cutting site 160 of the sealing region 115. A circuit element of the display region 106, a circuit element of the first drive circuit 111 and the bump part 128 of the sealing region 115 are formed by patterning. The bump part 128 is formed in a convex shape protruding from the first substrate 102 by stacking each layer within the same range. In this way, a large step difference is produced between the bump part 128 and an adjacent region. The bump part 128 is arranged on the outer periphery of a display panel. That is, the bump part 128 is arranged in a boundary region of each display panel.

Figure 11B:
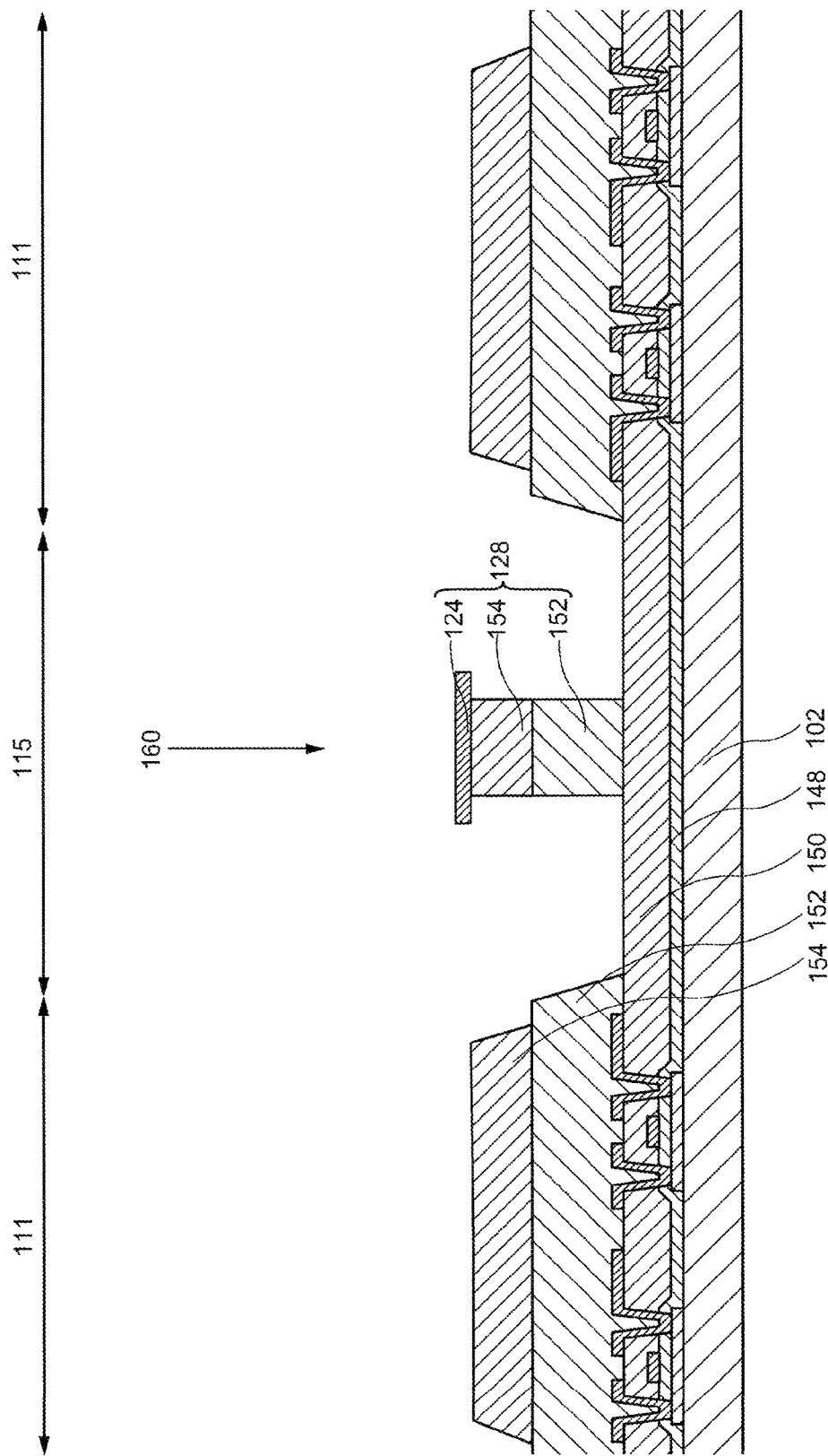
FIG. 11B is a cross-sectional diagram showing a manufacturing method related to one embodiment of the present invention.

Next, the bump part 128 is ashed. As is shown in FIG. 11B, the second insulation layer 152 and third insulation layer 154 of the bump part 128 are ashed. Although $O_2$ plasma ashing is used here as the ashing method, the present embodiment is not limited thereto and any ashing method in which selectivity of the second insulation layer 152 and third insulation layer 154 is higher than that of the common pixel electrode 124 which is a conductive layer may be used. Here, since an end part of the second insulation layer 152 and third insulation layer 154 of the display region 106 and first drive circuit 111 are sufficiently separated from the individual pixel electrode 122, common pixel electrode 124, gate electrode 142 and source/drain electrode 144, there is no effect on each circuit element even when the second insulation layer 152 and third insulation layer 154 are ashed. In this way, an end part of the common electrode 124 is formed in an eave shape protruding further to the outer side than an end part of the second insulation layer 152 and third insulation layer 154 in the bump part 128. However, the present embodiment is not limited thereto, and it is possible to select an appropriate ashing method depending on the material and combination of layers used in the formation of the bump part 128 and thereby at least a part of the side surface of the bump part 128 may be formed in a hollowed shape towards the inner side.

Figure 11C:
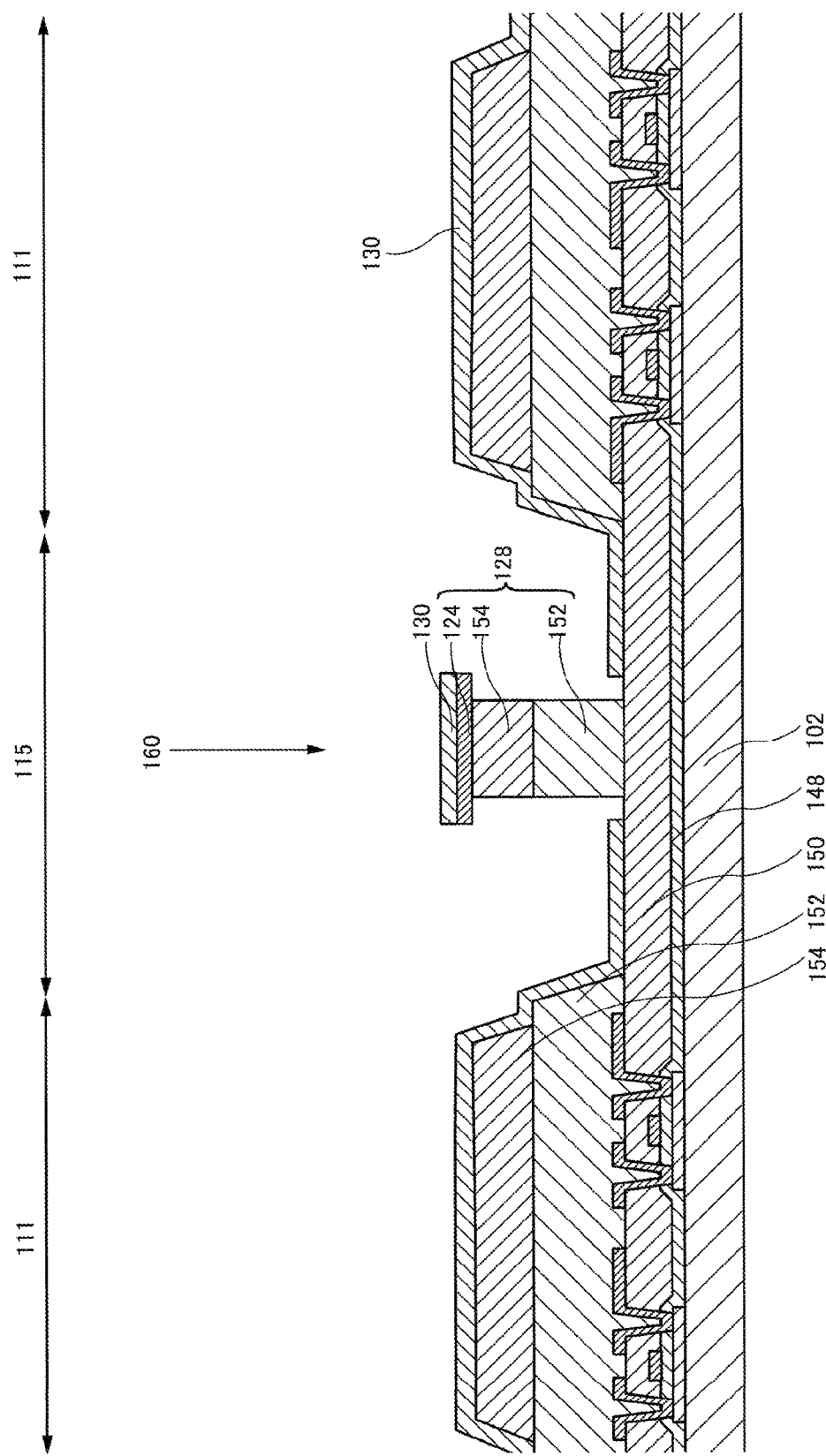
FIG. 11C is a cross-sectional diagram showing a manufacturing method related to one embodiment of the present invention.

Next, the first insulation film 130 is formed. As is shown in FIG. 11C, the first insulation film 130 is formed on a film formation surface of the first substrate 102 formed with circuits. In the present embodiment, a silicon nitride film is formed using a plasma CVD method. The first insulation film 130 in the present embodiment is formed so as to cover the display region 106 and the first drive circuit 111. The first insulation film 130 is formed above the bump part 128 and in an adjacent region also in the sealing region 115. However, due to the eave shape of the bump part 128, the first insulation film 130 is broken between a region adjacent to the bump part 128 and above the bump part 128. Since a large step difference exists between the bump part 128 and an adjacent region and a side surface of the bump part 128 is formed in a hollowed shape in the direction of the cutting site 160, the first insulation film 130 formed at once on approximately the entire surface of a display panel is not formed on a side surface of the bump part 128 in the sealing region 115. The first insulation film 130 in the sealing region 115 may be broken perpendicularly or may have a shape including an inclined surface.

Although not shown in FIG. 11A to FIG. 11E, next, the second insulation film 132 is formed above the display region 106. In the present embodiment, an acrylic resin film is formed using an inkjet method. The second insulation film 132 is formed so as to cover the display region 106. An end part of the second insulation film 132 at this time is arranged within an outer periphery part 113.

Figure 11D:
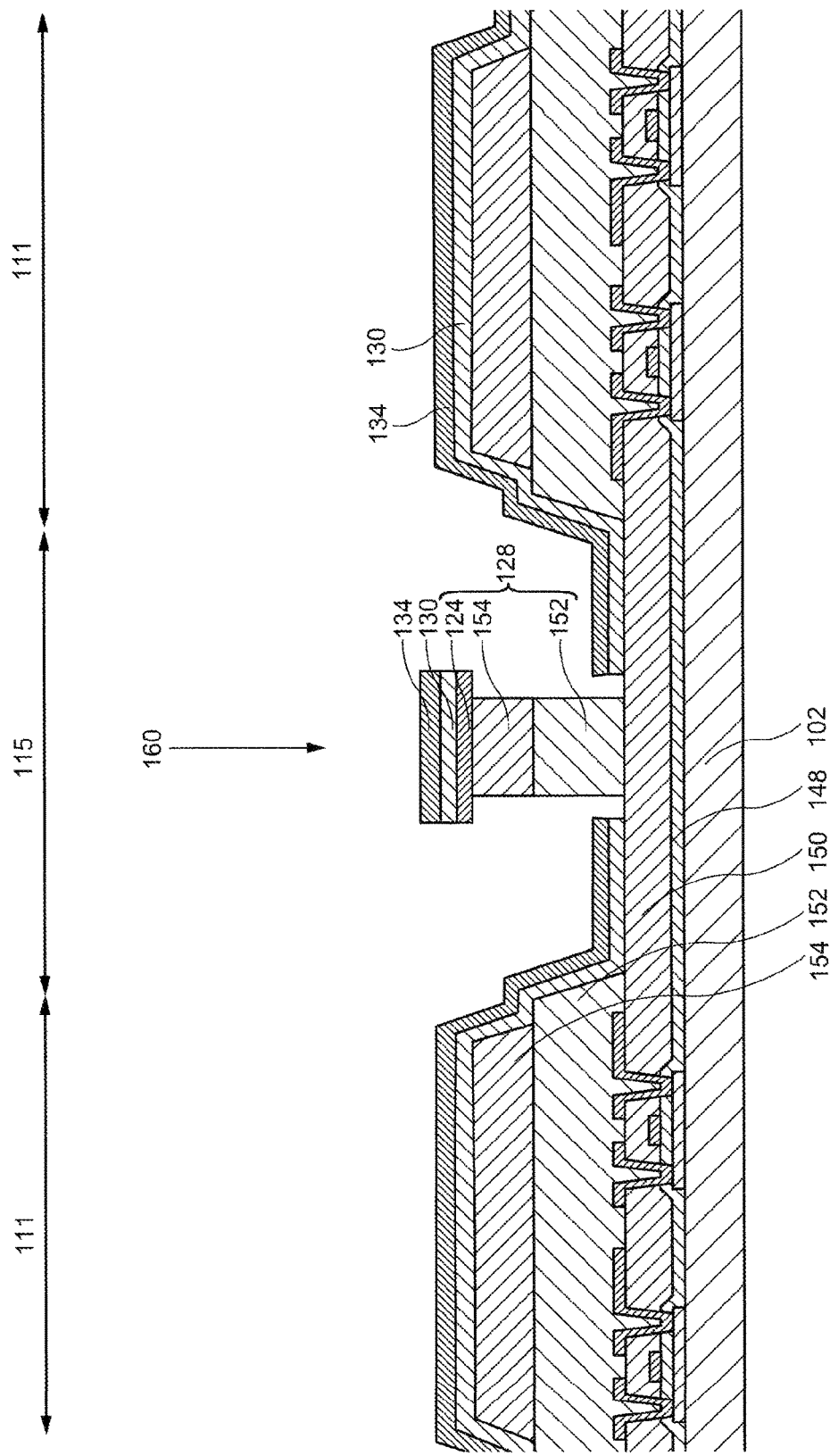
FIG. 11D is a cross-sectional diagram showing a manufacturing method related to one embodiment of the present invention.

Next, the third insulation film 134 is formed. As is shown in FIG. 11D, the third insulation film 134 is formed above the first insulation film 130 (and above the second insulation film 132). In the present embodiment, a silicon nitride film is formed using a plasma CVD method. In the present embodiment, the third insulation film 134 is formed so as to cover the display region 106 and the first drive circuit 111. The third insulation film 134 is formed above the bump part 128 and in an adjacent region also in the sealing region 115. However, due to the eave shape of the bump part 128, the third insulation film 134 is broken between a region adjacent to the bump part 128 and above the bump part 128. Since a large step difference exists between the bump part 128 and an adjacent region and a side surface of the bump part 128 has a hollowed shape in the direction of the cutting site 160, the third insulation film 134 formed at once on approximately the entire surface of a display panel is not formed on a side surface of the bump part 128 in the sealing region 115. An end part of the third insulation film 134 in the sealing region 115 may be broken perpendicularly or may have a shape including an inclined surface.

Next, the first substrate 102 is cut at the cutting site 160. Here, a plurality of display panels formed at once above the first substrate 102 are individually cut. As is shown in FIG. 11E, the bump part 128 is arranged in the cutting site 160. The top of the bump part 128 is cut when individually cutting the display panels. It is possible to use a scribe break using a scribing wheel, punch cutting, laser cutting or a combination of these as the cutting method.

When the first substrate 102 is cut at the cutting site 160, stress is applied to the first insulation film 130 and/or the third insulation film 134 and thereby micro-cracks may occur or each bump part may fall out. Furthermore, micro-cracks may develop by repeating transformation in the case of a flexible sheet display which may lead to a widening of a water infiltration path. Micro-cracks in the first insulation film 130 and/or third insulation film 134 which are sealing films become water infiltration paths and dark spots may be produced when they reach a light emitting element arranged in each pixel. In the present embodiment, the first insulation film 130 and third insulation film 134 arranged at the cutting site 160 are broken between the bump part 128 and an adjacent region in the sealing region 115. As a result, micro-cracks in the first insulation film 130 and third insulation film 134 above the bump part 128 which may occur during cutting can be prevented from developing in the direction of the display region 106.

The display device 100 shown in FIG. 10 is obtained by sealing each display panel which has been individually cut using the second substrate 104 using the sealing member 110. In the present embodiment, although the sealing member 110 is arranged in a region adjacent to the bump part 128 within the sealing region 115, the present embodiment is not limited thereto and may also be above the bump part 128 as long as it is within the sealing region 115. A region between the first substrate 102 and the second substrate 104 is blocked from the air by the sealing member 110 and the display region 106 is sealed therein.

As in the present embodiment, by adopting a sealing film structure stacked in three layers, it is possible to suppress water from infiltrating to a display region. By adopting a structure in which the first insulation film 130 and third insulation film 134 are broken within the sealing region 115, it is possible to prevent micro-cracks in an insulation film which can occur when cutting the first substrate 102 from developing and further suppress the infiltration of water. In this way, it is possible to provide a display device with high reliability. By combining with a sealing structure using a conventional sealing member 110, it is possible to expect further improvement in water resistance and provide a display device with even higher reliability. Although a structure was explained here in which the sealing member 110 which encloses the display region 106 is used when fixing the second substrate 104, the present embodiment is not limited to this structure and the sealing member 110 is not always necessary such as in the case where the second substrate 104 is fixed by another means.

Third Embodiment

In the first embodiment, the bump part 128 in the sealing region 115 is formed in a boundary region of a display panel and the top of the bump part 128 is cut. In the third embodiment, a plurality of bump parts 128 is formed in a boundary region of a display panel and a concave part of a bump part 128 gap is cut. Furthermore, since the structure of the display device 100 and a part of the manufacturing process are common in the present embodiment and the first embodiment, an overlapping explanation is omitted.

Figure 12:
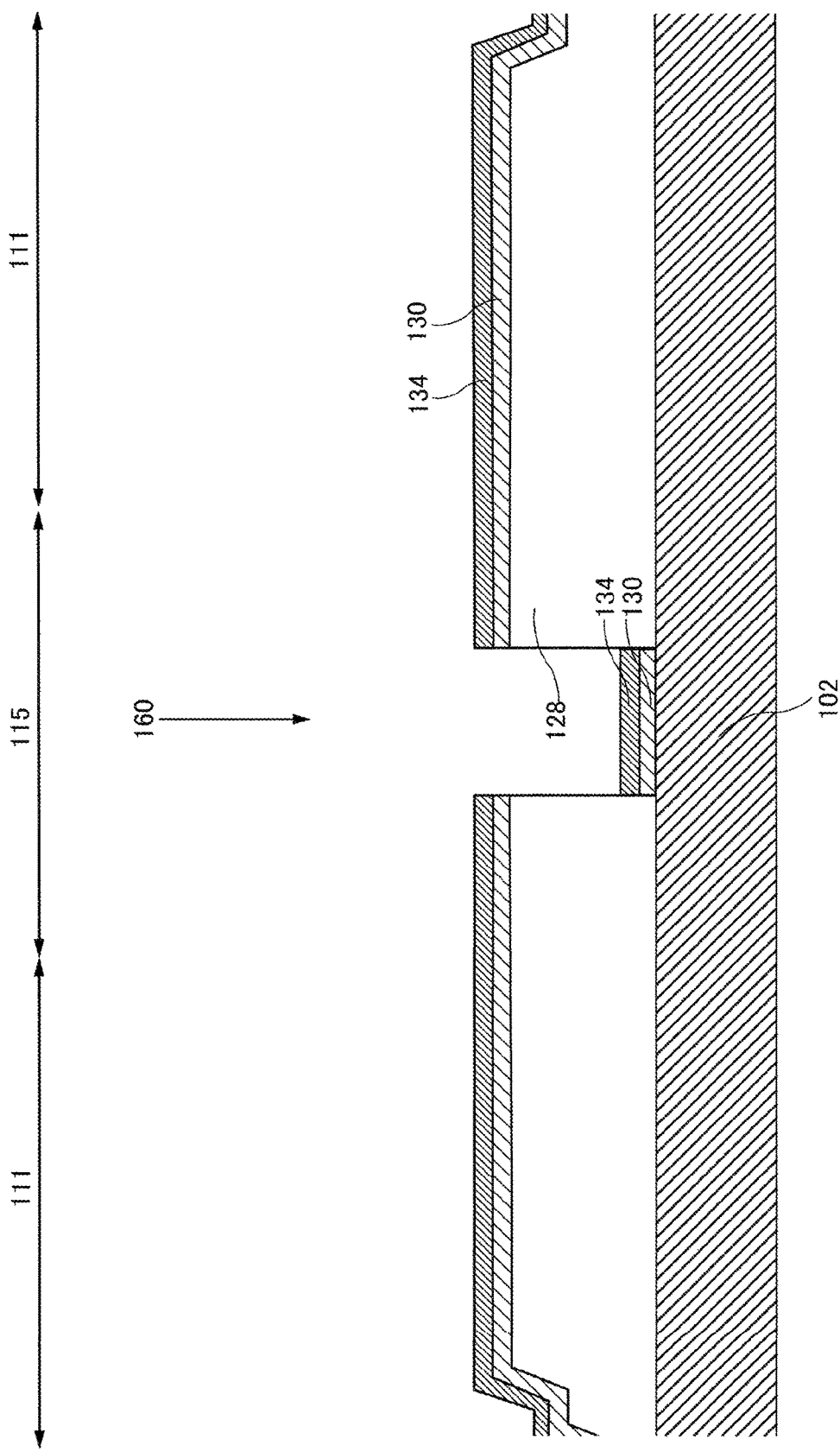
FIG. 12 is a cross-sectional diagram showing an approximate structure of a cutting site in a manufacturing method related to one embodiment of the present invention.

FIG. 12 is a cross-sectional diagram showing an approximate structure of a cutting site in a manufacturing method related to one embodiment of the present invention. As is shown in FIG. 12, the sealing region 115 is arranged in a boundary region of each display panel. The sealing region 115 includes a plurality of bump parts 128 and a concave part of a bump part 128 gap is provided in the cutting site 160. The bump part 128 in the present embodiment is formed by a circuit element layer arranged in the display region 106 and first drive circuit 111. However, the present embodiment is not limited thereto and the bump part 128 may be formed separately from a circuit element. The bump part 128 in the present embodiment is integrally formed with the first drive circuit 111. However, the present embodiment is not limited thereto and the bump part 128 may be formed as a separate body. The bump part 128 is formed in a convex shape protruding from the first substrate 102 by stacking each layer in the same range respectively. In this way, a large step difference is formed compared to an end part of the display region 106. That is, a large step difference is formed between the bump part 128 and an adjacent region. Furthermore, although a step difference between the bump part 128 and an adjacent region is shown perpendicularly in FIG. 12, the present embodiment is not limited thereto. A shape having an inclined surface is also possible. In addition, the height of a step difference between the bump part 128 and an adjacent region is preferred to be 2 μm or more. By providing such a height, it is possible to form a step break of the first insulation film 130 and the third insulation film 134.

In the present embodiment, a sealing film in the sealing region 115 has a stacked structure of two layers and is arranged with the first insulation film 130 and third insulation film 134 from the bottom layer side. In the sealing region 115, both of the two layers of the first insulation film 130 and third insulation film 134 are arranged above the bump part 128 and in an adjacent region. However, the two layers of the first insulation film 130 and third insulation film 134 are separated between a region adjacent to the bump part 128 and an upper surface of the bump part 128. A large step difference exists between the bump part 128 and an adjacent region and as a result the first insulation film 130 and third insulation film 134 formed at once on approximately the entire surface of a display panel are not formed on a side surface of the bump part 128 in the sealing region 115. In this way, by cutting a bump part gap arranged at a boundary of each display panel when individually cutting a multiple panel substrate, it is possible to prevent micro-cracks in the first insulation film 130 and third insulation film 134 which can occur when cutting from developing in the direction of the display region 106. In FIG. 12, an end part of the first insulation film 130 and third insulation film 134 in the sealing region 115 are broken perpendicularly. However, the present embodiment is not limited thereto and an end part of the first insulation film 130 and third insulation film 134 in the sealing region 115 may have a step shape or a shape having an inclined surface in which a film thickness decreases by such steps respectively. In addition, the shape of an end part of the first insulation film 130 and third insulation film 134 in the sealing region 115 may be different respectively or may be a combination of different shapes. In particular, by providing the end part of the first insulation film 130 and third insulation film 134 in a region adjacent to the bump part 128 with a step shape or a shape having an inclined surface the thickness of which decreases by such steps, it is possible to suppress the first insulation film 130 and third insulation film 134 from contacting or coming close to a side surface of the bump part 128, and it is possible to prevent stress applied when individually cutting or external stress from producing micro-cracks in the first insulation film 130 and third insulation film 134 covering the display region 106.

Figure 13:
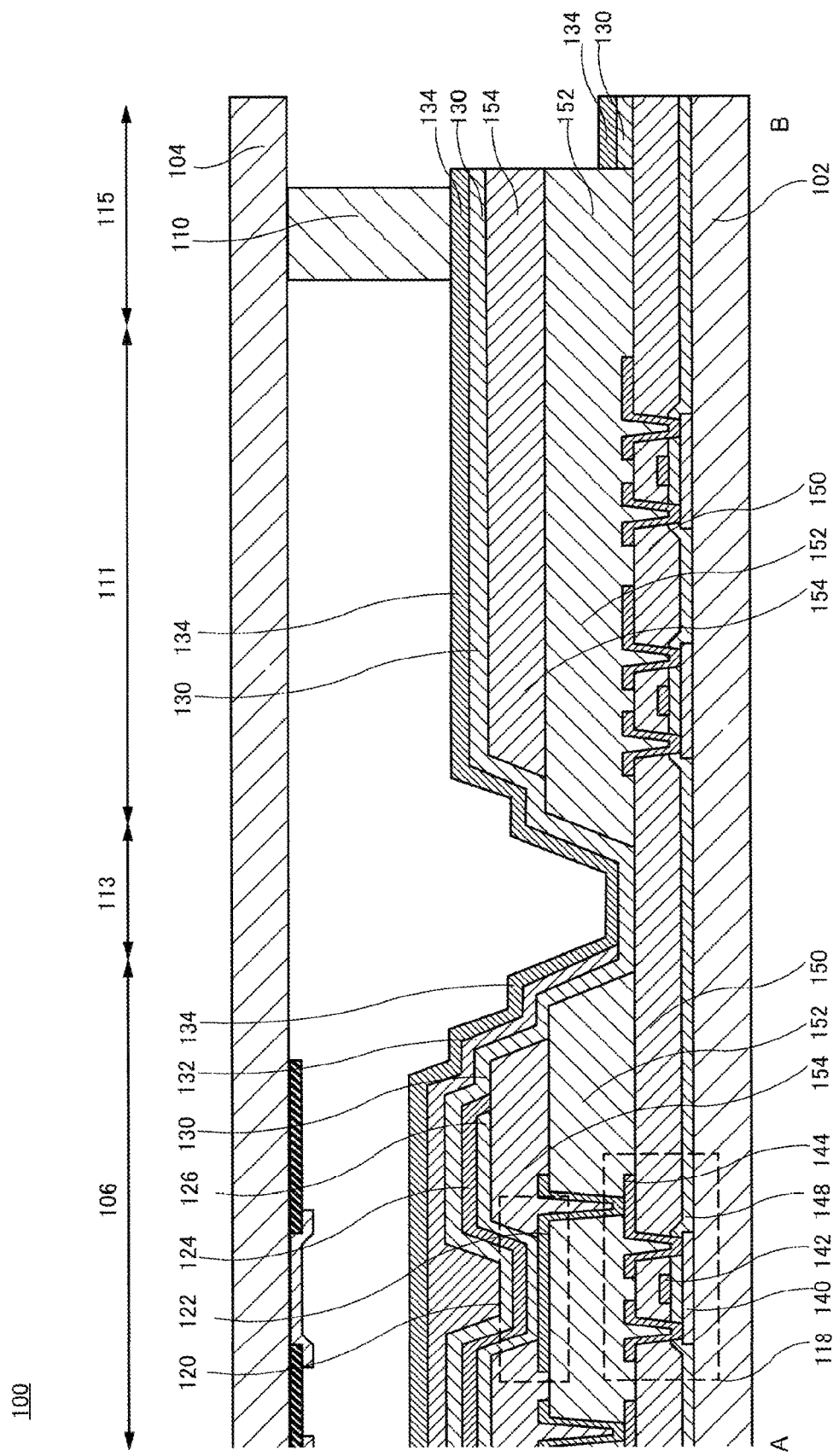
FIG. 13 is a cross-sectional diagram showing an approximate structure of a display device related to one embodiment of the present invention.

FIG. 13 is a cross-sectional diagram showing an approximate structure of the display device 100 related to the present embodiment. FIG. 13 shows a cross-sectional view along the line A-B shown in FIG. 2. The display device 100 is arranged with the sealing region 115, first drive circuit 111, the outer periphery part 113 and display region 106 from the B side end part of the first substrate 102.

The sealing region 115 in the present embodiment is formed with the bump part 128 by the second insulation layer 152 and the third insulation layer 154 which are an insulation layer arranged in the display region 106. However, the present embodiment is not limited thereto, and the bump part 128 may also be formed by the semiconductor layer 140 arranged in the display region 106, and the individual pixel electrode 122, the common pixel electrode 124, gate electrode 142 and source/drain electrode 144 which are conducting layers. The bump part 128 in the present embodiment is integrally formed with the first drive circuit 111. However, the present embodiment is not limited thereto and the bump part 128 may be formed as a separate body. The bump part 128 is formed in a convex shape protruding from the first substrate 102 by stacking each layer. In this way, a large step difference is produced between the bump part 128 and an adjacent region. Although a step difference between the bump part 128 and an adjacent region is shown perpendicularly in in FIG. 13, the present embodiment is not limited thereto and a shape having an inclined surface is also possible.

The bump part 128 is arranged so that an outer periphery of the display device serves as a bump part 128 gap. That is, a plurality of bump parts 128 is formed in a boundary region of each display panel and a bump part 128 gap is arranged to serve as an outer side end part of a sealing region. A bump part 128 gap is arranged in a boundary region of each display panel in a manufacturing method for simultaneously forming a plurality of display panels by individually cutting a multiple panel substrate.

A sealing film is arranged in an upper part of the display region 106, the first drive circuit 111 and the bump part 128. A sealing film is provided with a stacked structure of three layers in an upper part of the display region 106 in the present embodiment and is arranged with the first insulation film 130, second insulation film 132 and third insulation film 134 from the bottom layer side. An end part of the second insulation film 132 is arranged within the outer periphery part 113. On the other hand, both the first insulation film 130 and third insulation film 134 are arranged on approximately the entire surface of the first substrate 102. That is, at an end part of an insulation film stacked in three layers, a structure is provided in which the first insulation film 130 and third insulation film 134 cover the second insulation film 132.

A sealing film in the first drive circuit 111 and the sealing region 115 (including the bump part 128) in the present embodiment has a two layer stacked structure arranged with the first insulation film 130 and third insulation film 134 from the bottom layer side. The two layers of the first insulation film 130 and third insulation film 34 are both arranged to cover the first drive circuit 111. In the sealing region 115, both of the two layers of the first insulation film 130 and third insulation film 34 are arranged above the bump part 128 and in an adjacent region (including a bump part 128 gap). However, the two layers of the first insulation film 130 and third insulation film 134 are broken between a region adjacent to the bump part 128 and above the bump part 128. There is a large step difference between the bump part 128 and an adjacent region and as a result the first insulation film 130 and third insulation film 134 formed at once on approximately the entire surface of a display panel are in a discontinuous state at both side surfaces of the bump part 128 in the sealing region 115. In this way, when a multiple panel substrate is individually separated, by cutting the bump part 128 gap arranged at a boundary region of each display panel, it is possible to prevent micro-cracks in the first insulation film 130 and third insulation film 134 which can occur when cutting from developing. In FIG. 13, an end part of the first insulation film 130 and third insulation film 134 in the sealing region 115 are both broken perpendicularly in a region adjacent to the bump part 128 and above the bump part 128. However, the present embodiment is not limited thereto and an end part of the first insulation film 130 and third insulation film 134 in the sealing region 115 may also have a step shape or a shape having an inclined surface in which film the thickness decreases by each step. In addition, the shape of the end parts of the first insulation film 130 and third insulation film 134 in the sealing region 115 may each be different or may be a combination of different shapes.

The sealing member 110 is arranged in the sealing region 115. The sealing member 110 adheres the first substrate 102 with the second substrate 104. In the present embodiment, although the sealing member 110 is arranged above the bump part 128, the present embodiment is not limited thereto and the sealing member 110 may be arranged in a region adjacent to the bump part 128 as long as it is within the sealing region 115. A region between the first substrate 102 and the second substrate 104 is blocked from the air by the sealing member 110 and the display region 106 is sealed therein. Although a structure was explained here in which the sealing member 110 which encloses the display region 106 is used when fixing the second substrate 104, the present embodiment is not limited to this structure and the sealing member 110 is not always necessary such as in the case where the second substrate 104 is fixed by another means.

As in the present embodiment, by adopting a sealing film structure stacked in three layers, it is possible to suppress water from infiltrating to a display region. By adopting a structure in which the first insulation film 130 and third insulation film 134 are broken within the sealing region 115, it is possible to prevent micro-cracks in an insulation film which can occur when cutting the first substrate 102 from developing and further suppress the infiltration of water. In this way, it is possible to provide a display device with high reliability. Furthermore, by combining with a sealing structure using a conventional sealing member 110, it is possible to expect further improvement in water resistance and provide a display device with even higher reliability.

Manufacturing Method

Next, a manufacturing method of the display device 100 in the present embodiment is explained. FIG. 14A to FIG. 14D are cross-sectional diagrams showing a manufacturing method related to one embodiment of the present invention. FIG. 14A to FIG. 14D show a cross-section along the line C-D in FIG. 4. In the present embodiment, since it is possible to use an existing method for forming a circuit element layer, an explanation thereof is omitted. In FIG. 14A to FIG. 14D, a method for forming a sealing film in the first drive circuit 111 and the sealing region 115 is explained in further detail.

Figure 14A:
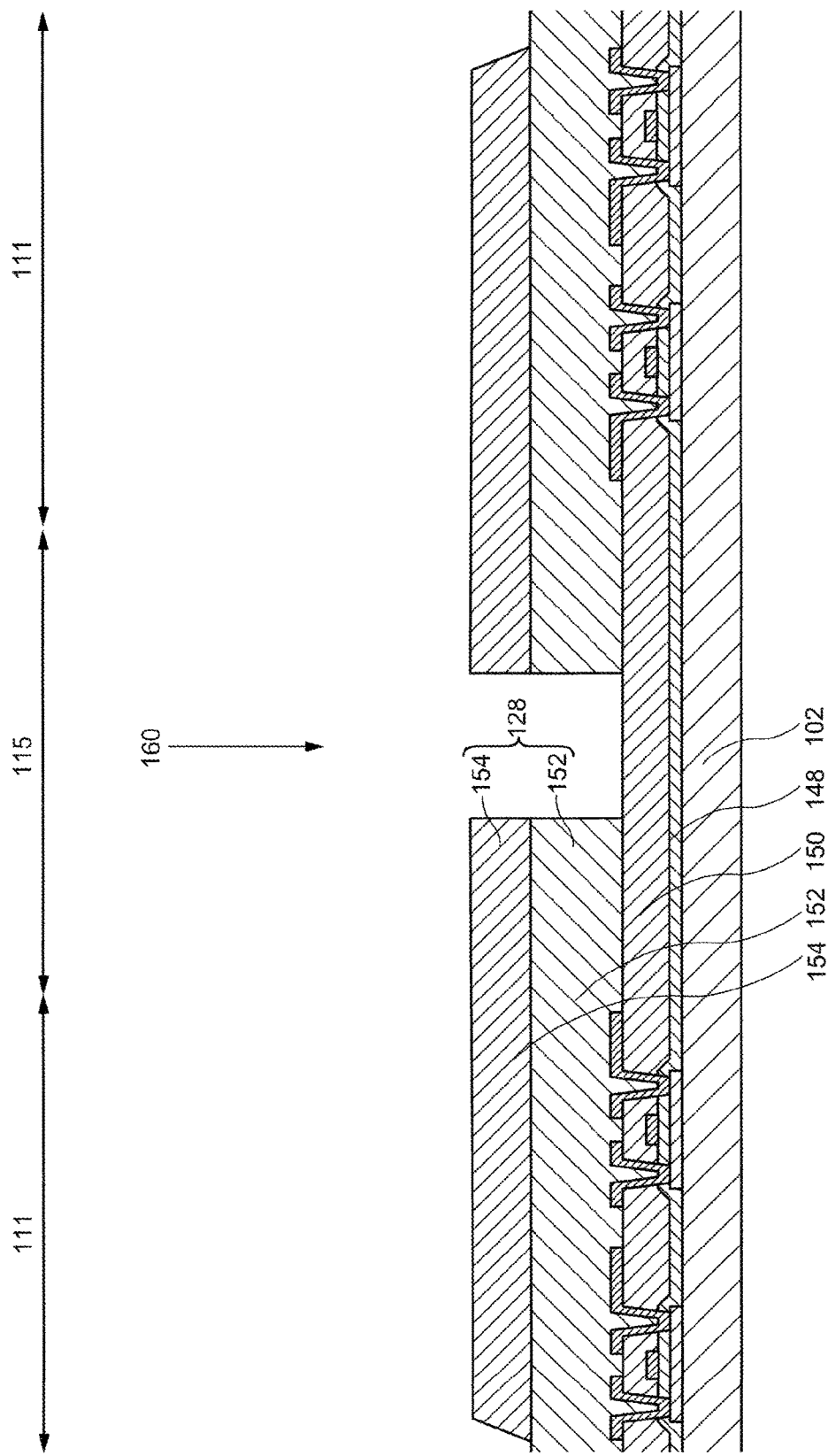
FIG. 14A is a cross-sectional diagram showing a manufacturing method related to one embodiment of the present invention.

FIG. 14A is a cross-sectional diagram of a first substrate 102 formed with each circuit element layer in the first drive circuit 111 and sealing region 115. Although not shown in FIG. 14A, a circuit element layer including a semiconductor layer, an insulation layer and a conducting layer is formed in the display region 106 and the first drive circuit 111. An end part of the circuit element layer in the display region 106 and the first drive circuit 111 may be respectively stacked in a step shape. A bump part 128 is formed by a second insulation layer 152 and third insulation layer 154 which are insulation layers arranged in the display region 106 and first drive circuit 111 in both end part of the sealing region 115. A circuit element of the display region 106, a circuit element of the first drive circuit 111 and the bump part 128 of the sealing region 115 are formed by patterning. The bump part 128 in the present embodiment is formed integrally with the first drive circuit 111. However, the present embodiment is not limited thereto and the bump part 128 may be formed as a separate body. The bump part 128 is formed in a convex shape protruding from the first substrate 102 by stacking each layer within the same range. In this way, a large step difference is produced between the bump part 128 and an adjacent region. The bump part 128 is arranged so that a bump part 128 gap serves as the cutting site 160. That is, a plurality of bump parts 128 is formed in a boundary region of each display panel and the bump part 128 gap is arranged to serve as an outer periphery of each display panel. Furthermore, although a step difference between the bump part 128 and an adjacent region is shown perpendicularly in FIG. 14A, the present embodiment is not limited thereto and a shape having an inclined surface is also possible.

Next, the first insulation film 130 is formed. As is shown in FIG. 14B, the first insulation film 130 is formed on a film formation surface of the first substrate 102 formed with circuits. In the present embodiment, a silicon nitride film is formed using a plasma CVD method. The first insulation film 130 in the present embodiment is formed so as to cover the display region 106 and the first drive circuit 111. The first insulation film 130 is formed above the bump part 128 and in an adjacent region also in the sealing region 115. However, due to the concave shape of the bump part 128 gap, the first insulation film 130 is broken between a region adjacent to the bump part 128 and above the bump part 128. A large step difference exists between the bump part 128 and an adjacent region and as a result the first insulation film 130 formed at once on approximately the entire surface of a display panel is not formed on a side surface of the bump part 128 in the sealing region 115. Furthermore, the first insulation film 130 in the sealing region 115 may be broken perpendicularly or may have a shape including an inclined surface.

Although not shown in FIG. 14A to FIG. 14D, next, the second insulation film 132 is formed above the display region 106. In the present embodiment, an acrylic resin film is formed using an inkjet method. The second insulation film 132 is formed so as to cover the display region 106. An end part of the second insulation film 132 at this time is arranged within an outer periphery part 113.

Figure 14C:
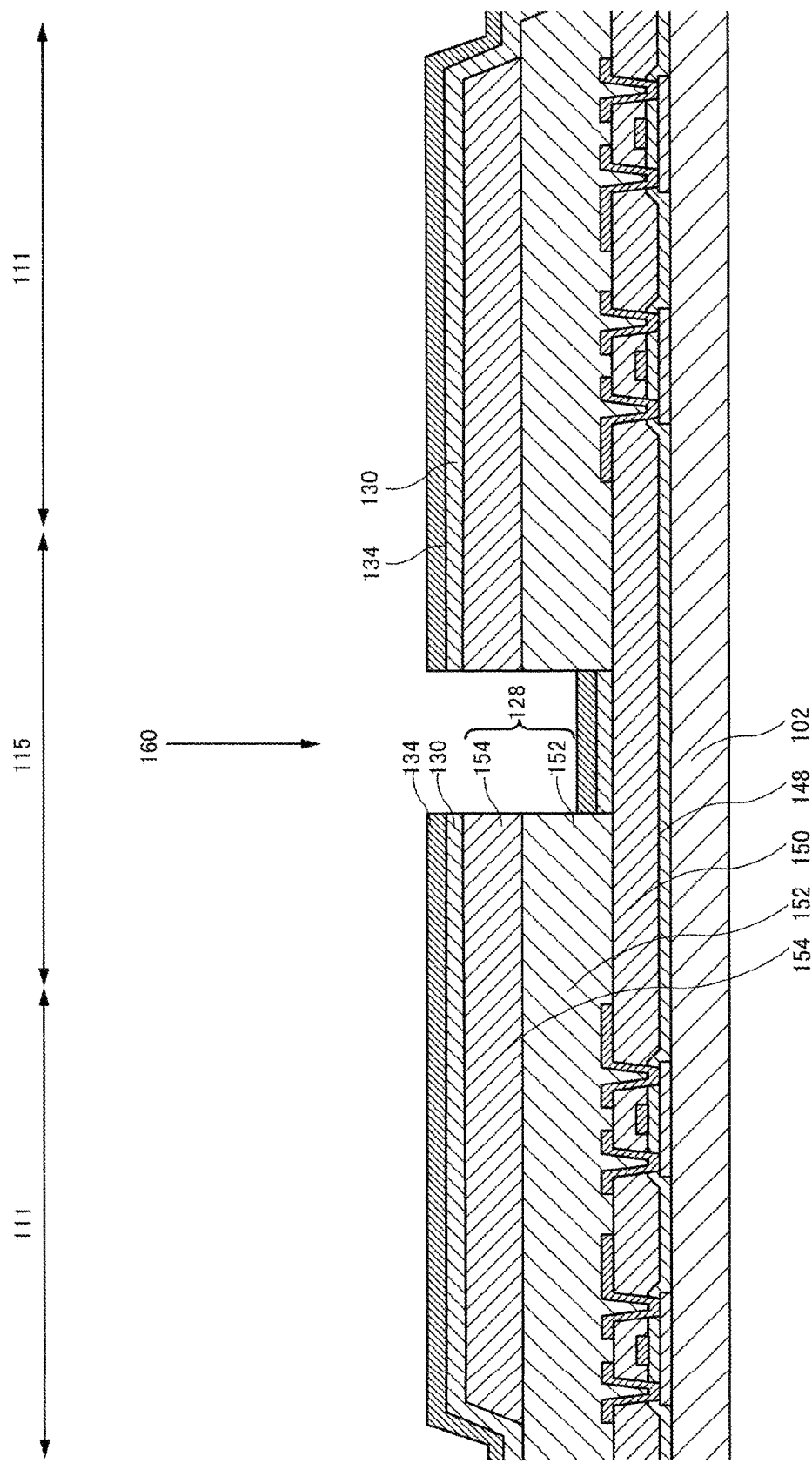
FIG. 14C is a cross-sectional diagram showing a manufacturing method related to one embodiment of the present invention.

Next, the third insulation film 134 is formed. As is shown in FIG. 14C, the third insulation film 134 is formed above the first insulation film 130 (and above the second insulation film 132). In the present embodiment, a silicon nitride film is formed using a plasma CVD method. In the present embodiment, the third insulation film 134 is formed so as to cover the display region 106 and the first drive circuit 111. The third insulation film 134 is formed above the bump part 128 and in an adjacent region also in the sealing region 115. However, due to the concave shape of the bump part 128 gap, the third insulation film 134 is broken between a region adjacent to the bump part 128 and above the bump part 128. A large step difference exists between the bump part 128 and an adjacent region and as a result the third insulation film 134 formed at once on approximately the entire surface of a display panel is not formed on a side surface of the bump part 128 in the sealing region 115. An end part of the third insulation film 134 in the sealing region 115 may be broken perpendicularly or may have a shape including an inclined surface.

Figure 14D:
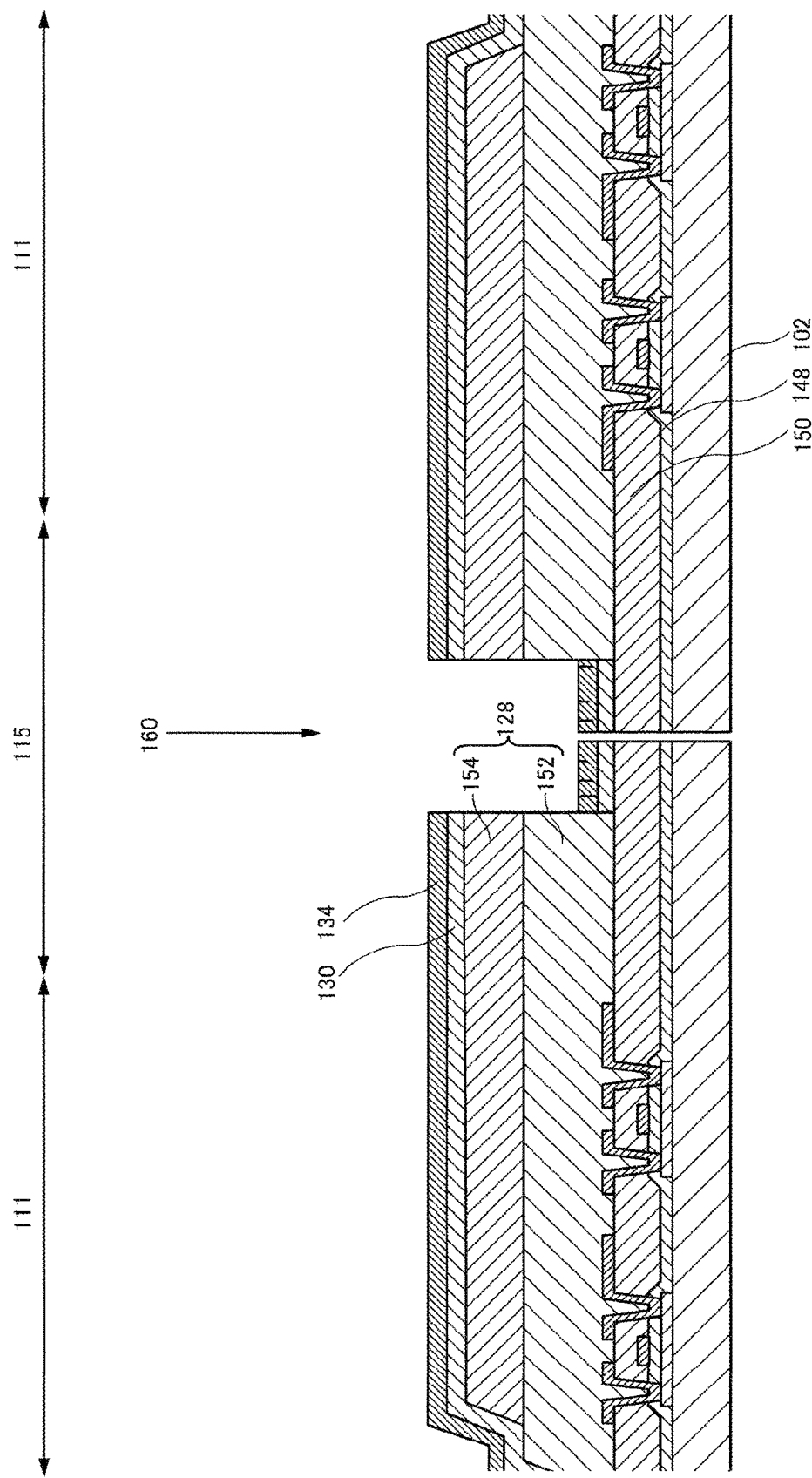
FIG. 14D is a cross-sectional diagram showing a manufacturing method related to one embodiment of the present invention.

Next, the first substrate 102 is cut at the cutting site 160. Here, a plurality of display panels formed at once above the first substrate 102 are individually cut. As is shown in FIG. 14D, the bump part 128 gap is arranged in the cutting site 160. The bump part 128 gap is cut when individually cutting the display panels. It is possible to use a scribe break using a scribing wheel, punch cutting, laser cutting or a combination of these as the cutting method.

When the first substrate 102 is cut at the cutting site 160, stress is applied to the first insulation film 130 and/or the third insulation film 134 and thereby micro-cracks may occur. Furthermore, micro-cracks may develop by repeating transformation in the case of a flexible sheet display which may lead to a widening of a water infiltration path. Micro-cracks in the first insulation film 130 and/or third insulation film 134 which are sealing films become water infiltration paths and dark spots may be produced when they reach a light emitting element arranged in each pixel. In the present embodiment, the first insulation film 130 and third insulation film 134 arranged at the cutting site 160 are broken between the bump part 128 and an adjacent region in the sealing region 115. As a result, micro-cracks in the first insulation film 130 and third insulation film 134 in the bump part 128 gap which may occur during cutting can be prevented from developing in the direction of the display region 106.

The display device 100 shown in FIG. 13 is obtained by sealing each display panel which has been individually cut using the second substrate 104 using the sealing member 110. In the present embodiment, although the sealing member 110 is arranged above the bump part 128 within the sealing region 115, the present embodiment is not limited thereto and may also be a region adjacent to the bump part 128 as long as it is within the sealing region 115. A region between the first substrate 102 and the second substrate 104 is blocked from the air by the sealing member 110 and the display region 106 is sealed therein. Furthermore, although a structure was explained here in which the sealing member 110 which encloses the display region 106 is used when fixing the second substrate 104, the present embodiment is not limited to this structure and the sealing member 110 is not always necessary such as in the case where the second substrate 104 is fixed by another means.

As in the present embodiment, by adopting a sealing film structure stacked in three layers, it is possible to suppress water from infiltrating to a display region. By adopting a structure in which the first insulation film 130 and third insulation film 134 are broken within the sealing region 115, it is possible to prevent micro-cracks in an insulation film which can occur when cutting the first substrate 102 from developing and further suppress the infiltration of water. In this way, it is possible to provide a display device with high reliability. Here, by combining with a sealing structure using a conventional sealing member 110, it is possible to expect further improvement in water resistance and provide a display device with even higher reliability.

The display device 100 and a manufacturing method thereof related to the preferred embodiments of the present invention were explained above. However, these are merely examples and the technical scope of the present invention is not limited to these embodiments. Actually, a person ordinarily skilled in the art can perform various modifications without departing from the concept of the present invention claimed within the scope of the patent claims. Therefore, such modifications are naturally also to be interpreted as belonging to the technical scope of the present invention.

What is claimed is:

1. A method of manufacturing a display device,
the method comprising:
forming a circuit element layer including a semiconductor layer, an insulating layer, and a conducting layer on a first region and a second region of a mother substrate;
forming a bump part in a boundary region between the first region and the second region, the bump part including at least one of the semiconductor layer, the insulating layer, and the conducting layer which simultaneously formed with the circuit element layer;
forming a sealing film on approximately the entire surface of the mother substrate including the first region, the second region, and the boundary region; and
dividing the first region and the second region at the boundary region by cutting the mother substrate and the bump part with the at least one of the semiconductor layer, the insulating layer, and the conducting layer.

2. A method of manufacturing a display device, the display device comprising:
the method comprising:
forming a circuit element layer including a semiconductor layer, an insulating layer, and a conducting layer on a first region and a second region of a mother substrate;
forming a plurality of bump parts in a boundary region between the first region and the second region, the plurality of bump parts including at least one of the semiconductor layer, the insulating layer, and the conducting layer which simultaneously formed with the circuit element layer;
forming a sealing film on approximately the entire surface of the mother substrate including the first region, the second region, and the plurality of boundary region; and
dividing the first region and the second region at the boundary region by cutting the mother substrate between the plurality of bump parts.

3. The method of manufacturing a display device according to claim 1, wherein the bump part includes at least the insulation layer, and is formed in a shape protruding from the first surface of the mother substrate.

4. The method of manufacturing a display device according to claim 3, wherein the bump part includes at least the insulation layer and the conducting layer, and is formed in a shape where an end part of the conducting layer protrudes to the outer side from the insulation layer.

5. The method of manufacturing a display device according to claim 3, wherein the bump part is formed by patterning when forming the circuit element layer.

6. The method of manufacturing a display device according to claim 5, wherein the circuit element layer includes an individual pixel electrode, a common pixel electrode, a light emitting layer, a semiconductor layer, a gate electrode, a source/drain electrode, a gate insulation layer, a first insulation layer, a second insulation layer and a third insulation layer, and the bump part includes at least one layer selected from the individual pixel electrode, the common pixel electrode, the semiconductor layer, the gate electrode, the source/drain electrode, the gate insulation layer, the first insulation layer, the second insulation layer and the third insulation layer.

7. The method of manufacturing a display device according to claim 6, wherein the sealing film is formed discontinuously between the bump part and an adjacent region.

* * * * *